(12) United States Patent
Popovic

(10) Patent No.: US 10,983,275 B2
(45) Date of Patent: Apr. 20, 2021

(54) METHOD AND APPARATUS FOR OPTICAL WAVEGUIDE-TO-SEMICONDUCTOR COUPLING FOR INTEGRATED PHOTONIC CIRCUITS

(71) Applicant: The Regents of the University of Colorado, a body corporate, Denver, CO (US)

(72) Inventor: Milos A. Popovic, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/465,466

(22) Filed: Mar. 21, 2017

(65) Prior Publication Data

US 2017/0269297 A1 Sep. 21, 2017

Related U.S. Application Data

(60) Provisional application No. 62/311,358, filed on Mar. 21, 2016, provisional application No. 62/311,355, filed on Mar. 21, 2016.

(51) Int. Cl.
*G02B 6/12* (2006.01)
*G02B 6/124* (2006.01)
(Continued)

(52) U.S. Cl.
CPC ........... *G02B 6/124* (2013.01); *G02B 6/1228* (2013.01); *G02B 6/305* (2013.01); *G02B 6/34* (2013.01);
(Continued)

(58) Field of Classification Search
CPC .. G02B 6/124; G02B 6/1228; G02B 27/4266; H01L 27/1203
See application file for complete search history.

(56) References Cited

U.S. PATENT DOCUMENTS 4,398,056 A 8/1983 Sheng
4,419,533 A 12/1983 Czubatyj et al.
(Continued)

FOREIGN PATENT DOCUMENTS

| CN | 102323646 A | 1/2012 |
|---|---|---|
| CN | 102749680 A | 10/2012 |
| JP | 03119778 A | 5/1991 |

OTHER PUBLICATIONS

Alonso-Ramos et al., Fiber-chip grating coupler based on interleaved trenches with directionality exceeding 95%, Opt. Lett. 39, 5351-5354 (2014).*

(Continued)

*Primary Examiner* — Peter Radkowski
(74) *Attorney, Agent, or Firm* — Lathrop GPM LLP

(57) ABSTRACT

A grating coupler couples a waveguide to a beam and is formed of patterned shapes in a first and second layer of planar material, the shapes embedded in background material, the layers separated by less than one wavelength. The shapes are organized as a plurality of adjacent unit cells arranged along a direction of propagation of light with each unit cell including a shape of the first material and a shape of the second material, each unit cell having design parameters including a period, a width wb of the shape of first planar material, a width wt of the shape of second planar material, and an offset between the shapes. The coupler has a directivity ratio D is at least 10 dB between "up" and "down" radiation; and unit cells differ in at least one parameter selected from period, wb, wt, and offset to provide a predetermined beam shape.

20 Claims, 21 Drawing Sheets

(51) Int. Cl.
| | |
|---|---|
| *H01L 27/12* | (2006.01) |
| *G02B 27/42* | (2006.01) |
| *G02B 6/122* | (2006.01) |
| *G02B 6/34* | (2006.01) |
| *G02B 6/30* | (2006.01) |

(52) U.S. Cl.
CPC ...... *G02B 27/4266* (2013.01); *H01L 27/1203* (2013.01)

(56) References Cited

U.S. PATENT DOCUMENTS

| | | | |
|---|---|---|---|
| 5,033,812 A | 7/1991 | Yoshida et al. | |
| 5,276,745 A | 1/1994 | Revelli, Jr. | |
| 5,315,676 A | 5/1994 | Sunagawa | |
| 5,581,642 A | 12/1996 | Deacon et al. | |
| 5,657,407 A | 8/1997 | Li et al. | |
| 5,926,493 A | 7/1999 | O'Brien et al. | |
| 6,819,426 B2 | 11/2004 | Sezginer et al. | |
| 6,850,670 B2 | 2/2005 | Parhami et al. | |
| 7,082,247 B1 | 7/2006 | Gunn, III et al. | |
| 7,260,293 B1* | 8/2007 | Gunn, III | G02B 6/124 385/37 |
| 7,655,489 B2 | 2/2010 | Hall | |
| 8,248,617 B2 | 8/2012 | de Groot | |
| 8,530,811 B2 | 9/2013 | Molnar | |
| 8,787,417 B2 | 7/2014 | Baets et al. | |
| 2002/0158193 A1 | 10/2002 | Sezginer et al. | |
| 2003/0021513 A1 | 1/2003 | Parhami et al. | |
| 2003/0206681 A1 | 11/2003 | Polonskiy et al. | |
| 2004/0071387 A1 | 4/2004 | Mule et al. | |
| 2004/0079963 A1 | 4/2004 | Taylor et al. | |
| 2005/0008294 A1 | 1/2005 | Park et al. | |
| 2005/0041922 A1 | 2/2005 | Yao | |
| 2005/0236033 A1 | 10/2005 | Lawandy | |
| 2007/0113887 A1 | 5/2007 | Laih | |
| 2007/0240759 A1 | 10/2007 | Borden | |
| 2008/0240655 A1 | 10/2008 | Parhami et al. | |
| 2008/0267237 A1 | 10/2008 | Hall et al. | |
| 2008/0285610 A1 | 11/2008 | Hall et al. | |
| 2009/0134486 A1 | 5/2009 | Fujikata | |
| 2009/0262362 A1 | 10/2009 | de Groot et al. | |
| 2009/0266413 A1 | 10/2009 | Mathai et al. | |
| 2011/0174998 A1 | 7/2011 | Molnar et al. | |
| 2011/0220971 A1 | 9/2011 | Haddad et al. | |
| 2012/0037208 A1 | 2/2012 | Ang | |
| 2012/0320939 A1 | 12/2012 | Baets et al. | |
| 2014/0193115 A1* | 7/2014 | Popovic | G02B 6/34 385/14 |

OTHER PUBLICATIONS

Benedikovic et al., High-directionality fiber-chip grating coupler with interleaved trenches and subwavelength index-matching structure, Opt. Lett. 40, 4190-4193 (2015).*
Haldane et al., Possible Realization of Directional Optical Waveguides in Photonic Crystals with Broken Time-Reversal Symmetry, Phys. Rev. Lett. 100, 013904, 2008.*
Soljacic et al., Presentation—"Unidirecctional backscattering-immune topological electromagnetic states (one-way-states)" at SIAM, 2010.*
Notaros et al., Analysis of Leaky-Wave Microphotonic Structures with a Complex-Wavevector Photonic Band Structure Solver, in Frontiers in Optics 2014, OSA Technical Digest (online) (Optical Society of America, 2014), paper FTh4D.3.*
Ming Dai, Leilei Ma, Yelong Xu, Minghui Lu, Xiaoping Liu, and Yanfeng Chen, "Highly efficient and perfectly vertical chip-to-fiber dual-layer grating coupler," Opt. Express 23, 1691-1698 (2015).*
Notaros et al., Analysis of Leaky-Wave Microphotonic Structures with a Complex-Wavevector Photonic Band Structure Solver, in Frontiers in Optics 2014, OSA Technical Digest (online) (Optical Society of America, 2014), paper FTh4D.3; (Year: 2014).*
Dai et al., Highly efficient and perfectly vertical chip-to-fiber dual-layer grating coupler, Opt. Express 23, 1691-1698 (2015); (Year: 2015).*
Gippius et al., Resonant mode coupling of optical resonances in stacked nanostructures, Optics Express, V. 18, N. 7, 2010 (Year: 2010).*
D. Vermeulen, S. Selvaraja, P. Verheyen, G. Lepage, W. Bogaerts, P. Absil, D. Van Thourhout, and G. Roelkens, "High-efficiency fiber-to-chip grating couplers realized using an advanced CMOS-compatible Silicon-On-Insulator platform," Opt. Express 18, 18278-18283 (2010) (Year: 2010).*
Orcutt, J.S. et al.,"Open foundry platform for high-performance electronic-photonic integration," Optics Express 12222, vol. 2, No. 11, May 21, 2012, 11 pp.
Lecamp, G. et al.,"Theoretical and computational concepts for periodic optical waveguides," Optics Express 11042, vol. 15, No. 18, Sep. 3, 2007, 19 pp.
Sacher, W.D. et al.,"Wide bandwidth and high coupling efficiency Si3N4-on-SOI dual-level grating coupler," Department of Electrical and Computer Engineering, University of Toronto, Institute of Microelectronics, A*STAR (Agency for Science, Technology and Research), Apr. 29, 2014, 10 pp.
Sacher, W.D. et al.,"Ultra-Efficient and Broadband Dual-Level Si3N4-on-SOI Grating Coupler," Department of Electrical and Computer Engineering, University of Toronto, Institute of Microelectronics, A*STAR (Agency for Science, Technology and Research), 2014, 2 pp.
Taillaert, D. et al.,"Compact efficient broadband grating coupler for silicon-on-insulator waveguides," Optics Letters, vol. 29, No. 23, Dec. 1, 2004, 3 pp.
Bock et al. (2008) "Demultiplexer with blazed waveguide sidewall grating and sub-wavelength grating structure", Optics Express, vol. 16, No. 22., 10 pp.
Bock et al. (2012) "Demonstration of a curved sidewall grating demultiplexer on silicon", Optics Express, vol. 20, No. 18, 11 pp.
Bolten et al. (2009) "CMOS compatible cost-efficient fabrication of SOI grating couplers, Microelectronic Engineering", vol. 86, Issues 4-6, pp. 1114-1116.
Chen et al. (2010) "Design of a high-efficiency grating coupler based on a silicon nitride overlay for silicon-insulator waveguides", Applied Optics, vol. 49, No. 33, pp. 6455-6462.
Chen et al. (Aug. 1, 2010) "Apodized Waveguide Grating Couplers for Efficient Coupling to Optical Fibers," IEEE Photonics Technology Letters. 22:1156-1158.
Fan et al. (2007) "High Directivity, Vertical Fiber-to-Chip Coupler with an isotropically Radiating Grating Teeth", The Conference on Lasers and Electro-Optics/Quantum Electronics and Laser Science Conference and Photonic Applications Systems Technologies, OSA Technical Digest Series, Paper CTuDD3, pp. 1-2.
Flory (2004) "Analysis of directional grating-coupled radiation in waveguide structures", in IEEE Journal of Quantum Electronics, vol. 40, No. 7, pp. 949-957.
Gunn (2006) "CMOS Photonics High-Speed Interconnects," IEEE Micro. 26:58-66.
Huang et al. (2006) A 1 OGb/s Photonic Modulator and WDM MUX/DEMUX Integrated with Electronics in 0.13μm SOI CMOS, In; The 2006 IEEE International Solid-Sate Circuits Conference: Digest of Technical Papers, Optical Communication 13.7, pp. 24-25.
Mekis et al. (2011) "A Grating-Coupler-Enabled CMOS Photonics Platform", in IEEE Journal of Selected Topics in Quantum Electronics, vol. 17, No. 3, pp. 597-608.
Miller et al. (1980) "Chirped and Curved Grating Coupler Focusing Both Outgoing Beam and Guided Wave," Optics Communications. 33:13-16.
Orcutt et al. (Jan. 31, 2011) "Nanophotonic Integration in State-of-the-Art CMOS Foundries," 19:2335-2346.
Orcutt et al. (May 21, 2012) "Open Foundry Platform for High-Performance Electronic-Photonic Integration," Optics Express. 20: 12222-12232.
Orobtchouk et al. (2000) "High-Efficiency Light Coupling in a Submicrometric Silicon-on-Insulator Waveguide," Applied Optics. 39: 5773-5777.

(56) References Cited

OTHER PUBLICATIONS

Peng et al. (2004) "Input-Grating Couplers for Narrow Gaussian Beam: Influence of Beam Depth," Optics Express. 12: 6481-6490.
Qiu et al. (2011) "Novel silicon-on-insulator grating couplers based on CMOS poly-silicon gate layer", Communications and Photonics Conference and Exhibition, 2011, ACP. Asia, Shanghai, pp. 1-6.
Roelkens et al. (2006) "High-Efficiency Silicon-on-Insulator Grating Coupler Based on a Poly-Silicon Overlay," Optics Express. 14:11622-11630.
Schmid et al. (2009) "Optimized Grating Coupler with Fully Etched Slots," Optics Express. 17:11066-11076.
Sohn et al. (2004) "Focusing Grating Coupler for Blue Laser Light," IEEE Photonics Technology Letters. 16: 162-164.
Soljacic et al. (2010) "Presentation—'Unidirectional backscattering-immune topological electromagnetic states (one-way-states)'", Presented at SIAM 2010.
SPIE Proceedings Publication Timeline/Guidelines; http://spie.org/publications/conference-proceedings ("The original research papers presented at SPI E conferences are available 2 to 4 weeks after the conferences in the SPI E Digital Library."). http://spiedigitallibrary.org/.
Steindorfer et al. (2012) "Detailed simulation of structural color generation inspired by the Morpho butterfly", Opt. Express, 20, pp. 21485-21494.
Taillaert et al. (2002) "An Out-of-Plane Grating Coupler for Efficient Butt-Coupling Between Compact Planar Waveguides and Single-Mode Fibers," IEEE Journal of Quantum Electronics. 38:949-955.
Taillaert et al. (2004) "Compact efficient broadband grating coupler for silicon-on-insulator waveguides", Opt. Lett. 29, pp. 2749-2751.
Tang et al. (2010) "Highly efficient nonuniform grating coupler for silicon-on-insulator nanophotonic circuits", Opt. Lett., vol. 35, No. 8, pp. 1290-1292.
The Luxtera CMOS Integrated Photonic Chip in a Molex Cable, R. Krishnamurthy, Dec. 2012, available at: http://www.chipworks.com/en/technical-competitive-analysis/resources/blog/the-luxtera-cmos-integrated-photonic-chip-in-amolex-cable/.
Ura et al. (1988) "Focusing Grating Couplers for Polarization Detection", Journal of Lightwave Technology. 6: 1028-1033.
Van Laere et al. (2006) "Compact Grating Couplers Between Optical Fibers and Silicon-on-Insulator Photonic Waveguides with 69% Coupling Efficiency," In; The IEEE 2006 Optical Fiber Communication Conference and the 2006 National Fiber Optic Engineers Conference, pp. 1-3.
Vermuelen et al. (2010) "High-efficiency fiber-to-chip grating couplers realized using an advanced CMOS-compatible Silicon-On-Insulator platform", Optics Express 18278, vol. 18, No. 17, 6 pages.
Wang et al. (2005) "Stratified Waveguide Grating Coupler for Normal Fiver Incidence", Optics Letter. 30, pp. 845-847.
Westerveld et al. (2011) "Optimized 3-D Simulation Method for Modeling Out-of-Plane Radiation in Silicon Photonic Integrated Circuits," IEEE Journal of Quantum Electronics, vol. 47, 561-568.
Wirth (2011) "Silicon Grating Couplers for Low Loss Coupling between Optical Fiber and Silicon Nanowires", Thesis, Purdue University, 2011, available at https://engineering.purdue.edu/~fsoptics/thesis/Wirth_Justin_MS.pdf.
Yang et al. (2011) "High-performance and compact binary blazed grating coupler based on an asymmetric subgrating structure and vertical coupling", Opt. Lett. 36, pp. 2614-2617.
Yao et al. (2011) "Grating-Coupler-Based Optical Proximity Coupling for Scalable Computing Systems", Proceedings of SPIE, 794405, pp. 1-7.

\* cited by examiner

Upward directional (constructive interference up)

(destructive interference down)

Downward directional (destructive interference up)

(constructive interference down)

Upward directional

Downward directional (constructive interference up)

(destructive interference up)

(destructive interference down)

(constructive interference down)

Upward directional (constructive interference up)

(destructive interference down)

Downward directional (destructive interference up)

(constructive interference down)

FIG. 14B
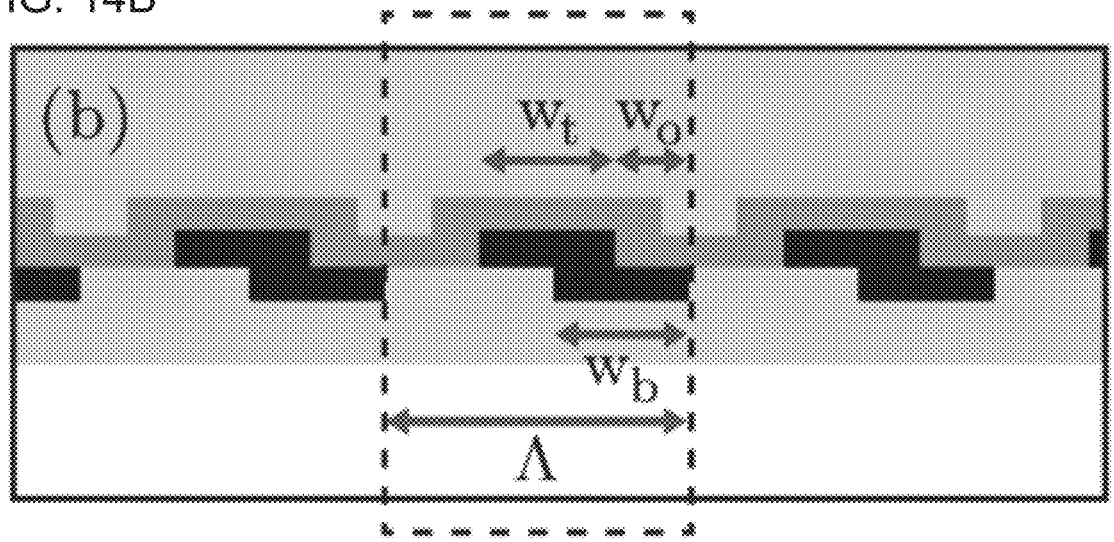
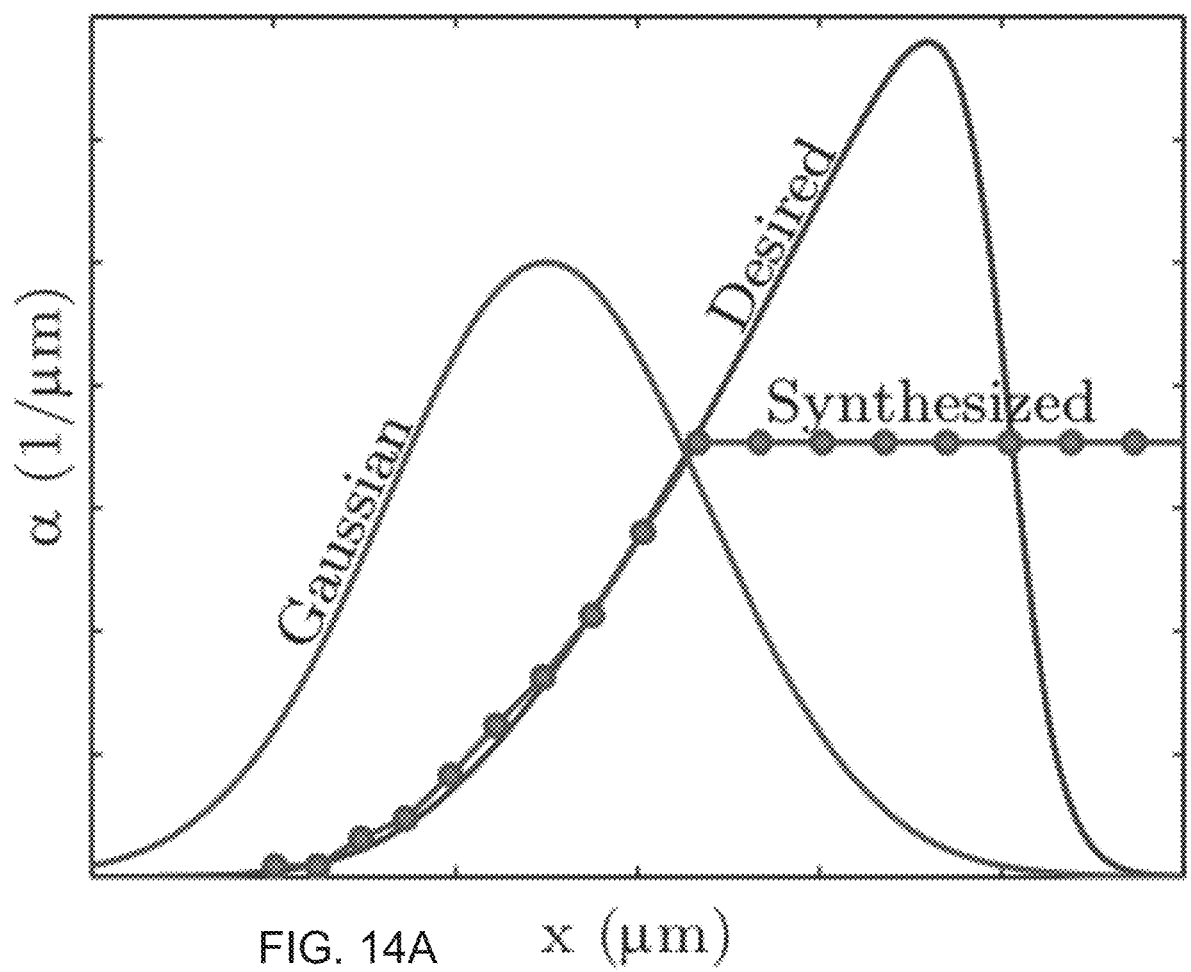
FIG. 14A

FIG. 15A
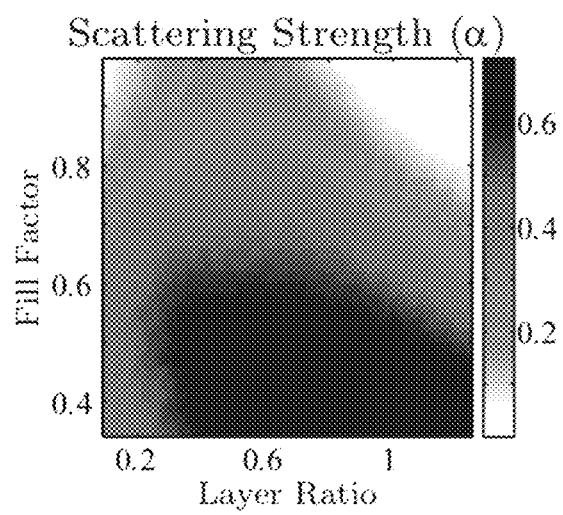
FIG. 15B
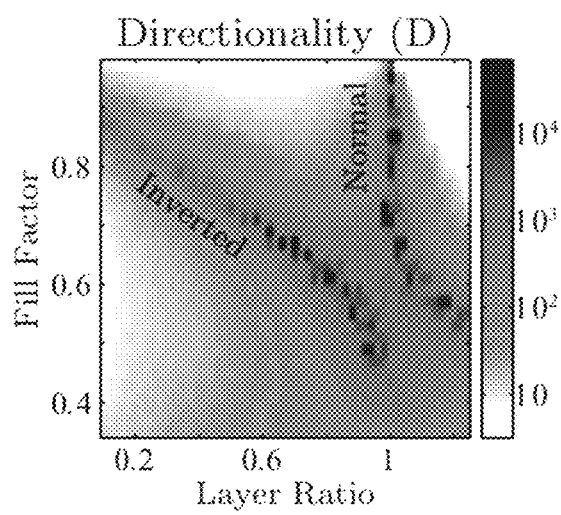
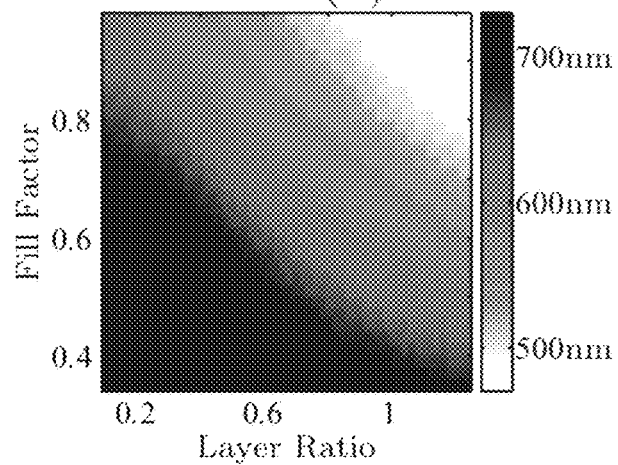
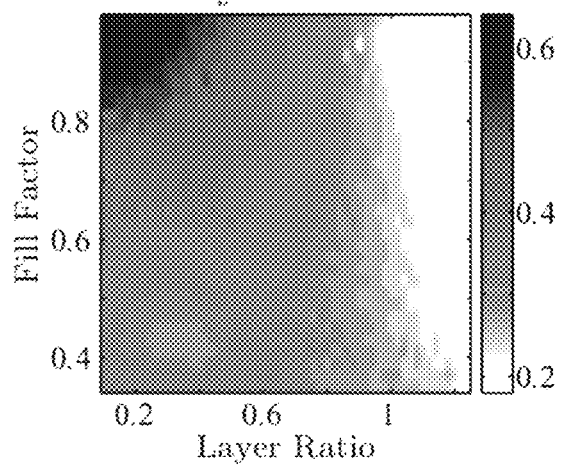
FIG. 15C
FIG. 15D

FIG. 23A
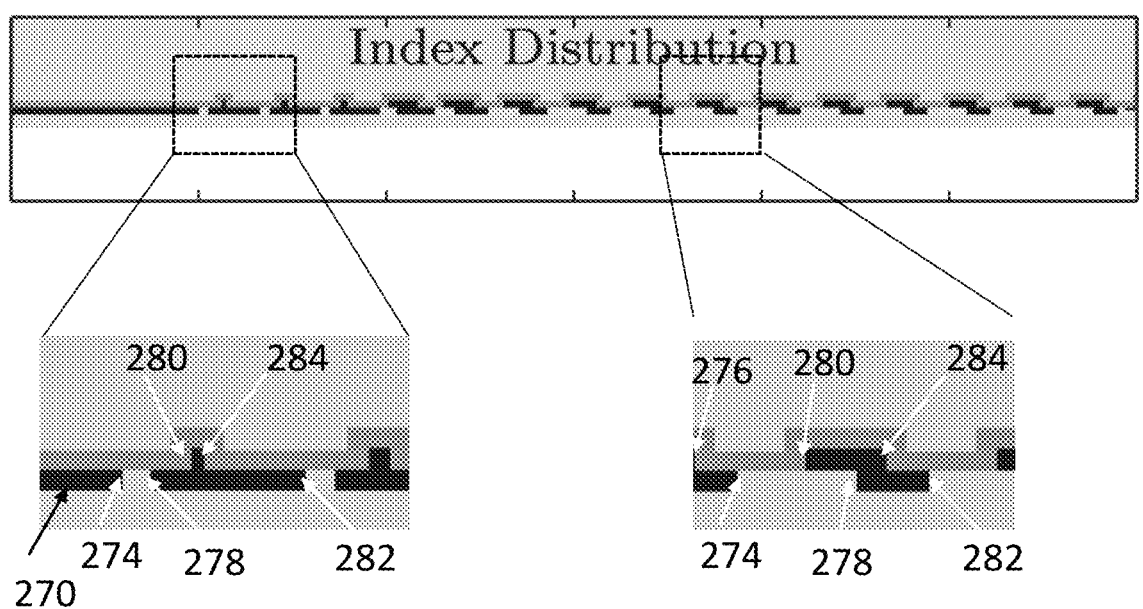
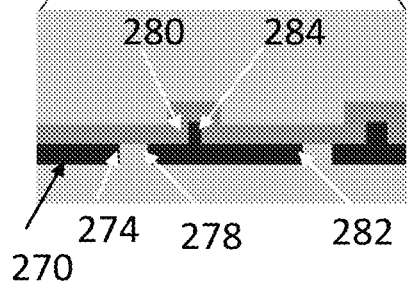
FIG. 23B
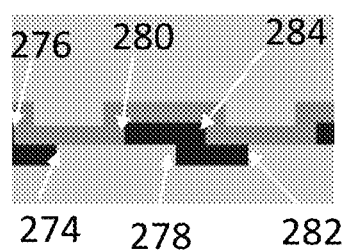
FIG. 23C

METHOD AND APPARATUS FOR OPTICAL WAVEGUIDE-TO-SEMICONDUCTOR COUPLING FOR INTEGRATED PHOTONIC CIRCUITS

PRIORITY CLAIM

The present document claims priority to U.S. Provisional Patent Application 62/311,358 filed 21 Mar. 2016, and U.S. Provisional Patent Application 62/311,355 filed 21 Mar. 2016. The entirety of the aforementioned patent applications are incorporated herein by reference.

GOVERNMENT INTEREST

This invention was made with government support under grant number HR0011-11-C-0100 awarded by DOD/DARPA, and ECCS1128709 awarded by National Science Foundation. The government has certain rights in the invention.

TECHNICAL FIELD

The present document relates to the field of integrated circuits having integrated optical devices and, in many embodiments, electronic devices on the same die. In particular embodiments, the integrated optical devices include optical waveguides and other optical components on a same die as CMOS circuitry.

BACKGROUND

There are many applications, including cameras, optical data transmitters, and optical data receivers, where electronic circuitry and optical devices are combined on a single integrated circuit.

It is also widely known that a significant limitation of modern processors and system-on-a-chip design is data transfer between functional units on a very large-scale integrated (VLSI) circuit; where distributed resistance and capacitance of interconnect may significantly limit data rates. An electro-optical interconnect may help solve this limitation on data rates. Further, many VLSI-based system designs suffer limitations on data rate due to the resistance of bondpad drivers and capacitance of chip-to-chip interconnect; electro-optical interconnects may prove a solution to this problem also. Furthermore, the energy per bit transferred of electronic interconnects may place a power budget limitation on the operation of an electronic microchip. Electro-optical interconnects may enable lower energy per bit interconnects. Finally, electrical interconnects may incur electrical cross-talk between adjacent wire lines that limits the spatial bandwidth density of interconnection to/from a chip. Optical interconnects may employ dense wavelength division multiplexing (DWDM) to achieve orders of magnitude higher bandwidth density without incurring significant cross-talk penalties.

Integrated photonics, including silicon photonics, has potential to enable electronic-photonic circuits with advanced optical signal processing functions and capabilities. One important area of application is energy-efficient photonic links for processor to memory chip communication, as well as chip-to-chip and on-chip interconnects. Other applications include active optical cables for rack-to-rack interconnects, transmitters and receivers for 100 Gbps Ethernet and beyond, as well as applications such as sensing, imaging (e.g. optical coherence tomography, etc.) and image/video projection applications, beam steering, and visible light biophotonic chips for high throughput biotechnology applications.

Integrated and silicon photonics typically employ customized fabrication processes. For silicon photonics, this typically means using silicon-on-insulator (SOI) wafers with a thick-oxide thickness of 2-3 microns, and materials and/or lithography and process steps that are tailored to photonics, these process modifications are not compatible with high density microelectronics.

Microelectronics, on the other hand, relies on carefully optimized complementary metal oxide semiconductor (CMOS) processes, such as those used for microprocessors and dynamic random access memory (DRAM) chips. Key potential applications for photonic integrated circuits include communications between state of the art CMOS logic chips including microprocessors and DRAM memory chips; optical interfaces to network processing chips, as well as other aspects of communications systems and mixed electronic-optical signal processing chips. CMOS-SOI (CMOS processes using silicon on insulator substrates) processes that include transistors usually are also optimized for microelectronics. Exceptions are SOI silicon photonics processes which usually do not support transistor integration, especially not advanced-node (e.g. sub 65 nm) transistors.

Efficient optical fiber to on-chip waveguide coupling, and photonic vias for chip to chip, die to die, or layer to layer communication within a chip/die, are also desirable in photonic chips with applications in communications, cameras, and other devices fabricated using CMOS and CMOS-SOI electronics processes (examples including GlobalFoundries GFUS 45RFSOI and 12SOI 45 nm and 32SOI 32 nm SOI processes, and e.g. 10LPe 65 nm bulk CMOS (all formerly IBM)), as well as custom photonics (e.g. IMEC ISIPP50G, LETI and IHP as accessible e.g. through the Europractice IC portal; AIM Photonics Institute (Albany, N.Y.) Passives and Actives silicon photonics processes as of this writing, IME Singapore, and others), and custom electronics-photonics processes (such as processes co-developed by Luxtera, Inc. and Freescale).

Three-dimensional (3D) die stacking results in chips having multiple die bonded together. An example is the Hybrid Memory Cube (HMC) (Trademark of Hybrid Memory Cube Consortium, Beaverton, Oreg.) technology for stacked memory chips. Electrical power and communication between dies in the stack may be done off-chip via wire bonding, or using through silicon vias (TSVs). Optical interconnection between device layers of several stacked die chips may prove an alternative to electrical interconnections.

SUMMARY

A grating coupler couples a waveguide to a beam and is formed of patterned shapes in a first and second device layer of planar material, the shapes embedded in background material, the layers separated by less than one wavelength. The shapes are organized as a plurality of adjacent unit cells arranged along a direction of propagation of light with each unit cell including a shape of the first material and a shape of the second material, each unit cell having design parameters including a period, a width wb of the shape of first planar material, a width wt of the shape of second planar material, and an offset in the plane between the shapes. The coupler has a directivity ratio D of least 10 dB between "up"

and "down" radiation; and unit cells differ in at least one parameter selected from period, wb, wt, and offset to provide a predetermined beam shape.

BRIEF DESCRIPTION OF THE FIGURES

In FIGS. 11A and 11B, a plane wave from the left constructively interferes up (FIG. 11A), and destructively downward (FIG. 11B). With the order of the scatterers switched, the radiation interferes constructively down (FIG. 11D) and destructively up (FIG. 11D).

In FIGS. 12A and 12B, a plane wave from the left constructively interferes up (FIG. 12A), and destructively downward (FIG. 12B). With the order of the scatterers switched, the radiation interferes constructively down (FIG. 12D) and destructively up (FIG. 12D).

In FIGS. 13A and 13C, a plane wave from the left constructively interferes up, and destructively downward in FIGS. 13B and 13D. With the order of the scatterers switched, the radiation interferes constructively down and destructively up.

FIG. 14B is a schematic cross-section illustration showing 3 unit cells of a non-uniform grating structure, showing the four parameters that parametrize a unit cell in this example geometry.

FIG. 14A shows a desired Gaussian beam field distribution along the grating, the derived desired scattering strength vs. position along the grating, and the actual grating strength synthesized using the herein proposed method.

FIG. 15A shows the scattering strength, $\alpha$, of a unit cell in the up/down output radiation direction of interest (in this case down) plotted vs. layer widths ratio r=wt/wb, and fill factor f=wb/$\Lambda$, with period $\Lambda$ and offset wo selected at each point to fix the output angle at the target output angle value (here 20°) and maximize directivity. Design wavelength is 1200 nm.

FIG. 15B shows the directivity of a unit cell plotted vs. layer ratio r=wt/wb, and fill factor f=wb/$\Lambda$, with period $\Lambda$ and offset wo selected to fix the output angle (20°) and maximize directivity. Design wavelength is 1200 nm.

FIGS. 15C and 15D provide the corresponding period $\Lambda$ and layer offset wo, respectively, for each point, defined by the coordinates (r,f)=(layer ratio, fill factor), in the scattering strength plot of FIG. 15A and directivity plot in FIG. 15B.

FIG. 23A shows a schematic cross-section of the structure of FIG. 17A and indicates locations of two magnified regions.

FIGS. 23B and 23C show magnified regions of the structure in FIG. 23A.

DETAILED DESCRIPTION OF THE EMBODIMENTS

Figure 3:
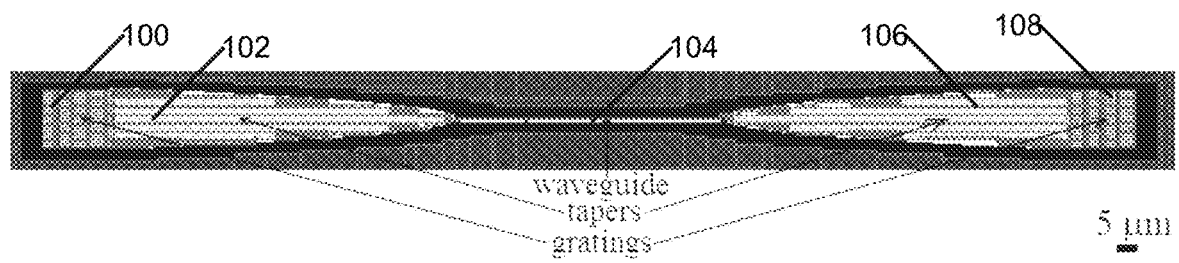
FIG. 3 shows a top view layout of two grating couplers connected by a waveguide, each grating coupler having a grating (also referred to as a "grating array"), and a waveguide taper to transform the guided mode from a small cross-section waveguide to the width of the grating.
Figure 4:
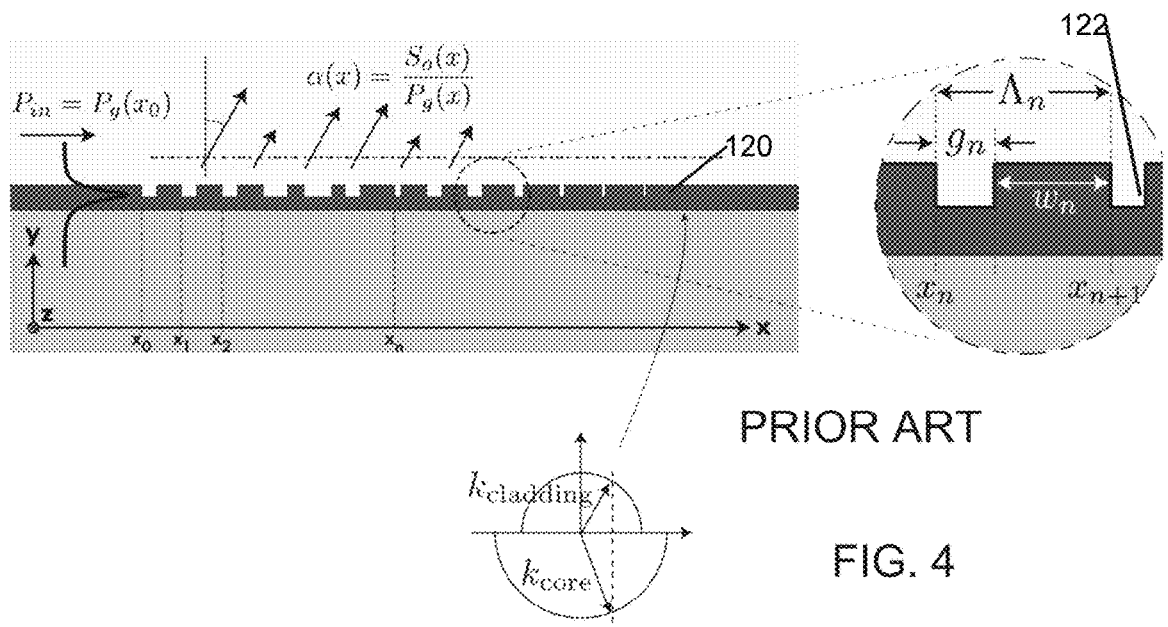
FIG. 4 is a schematic cross-section of a portion of a PRIOR ART grating array, illustrating a non-uniform grating structure formed of partial-thickness cuts of constant depth and varying widths, defined by a lithographic mask, into a top surface of a core material (such as silicon) waveguide layer.
Figure 5:
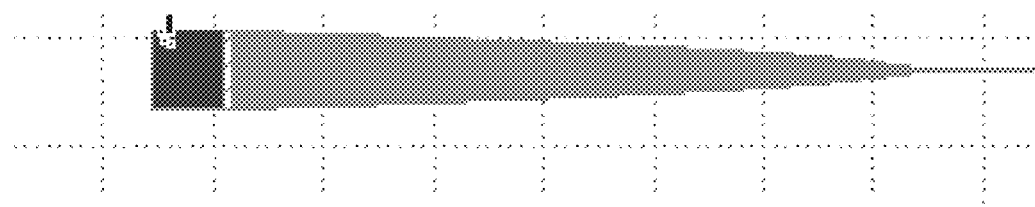
FIGS. 5-8 are example top view chip layout views of grating couplers having transverse segmentation in some grating bars formed on a polysilicon layer.

We provide an optical coupler adapted to radiate a unidirectional beam of a desired field distribution shape in the beam cross-section, which in some embodiments is a Gaussian field distribution, from an in-plane guided wave excitation on an optical or optoelectronic integrated circuit chip. Radiation out of plane is provided by the "array antenna" behavior of a grating structure as shown in FIGS. 3-9. FIG. 3 is a top plan view of a grating coupler assembly such as may be used for testing. This structure has a first coupler with a grating 100 and a taper structure 102 that may receive in incident beam and couple light into a waveguide 104. Waveguide 104 feeds light into a second coupler having taper structure 106 and thence to grating 108. FIG. 4 illustrates a portion of grating 108.

In the grating structures shown in FIGS. 3-9, in-plane guided wave light incident on the array can be thought, in the weak perturbation picture, to produce a polarization current in each perturbation to the uniform (z-invariant) waveguide structure, within each grating gap or bar. Grating bars may also be referred to as grating teeth. Grating bars may have a uniform cross-section across a transverse waveguide width (in the direction normal to the cross-section such as the one shown in FIG. 14B). Grating bars may also be curved in the transverse direction. Whether straight or curved, grating bars may be segmented, perforated or otherwise patterned in the transverse direction by the same mask that defines the bar width (horizontal width of bar in a cross-sectional view such as FIG. 14B). Such segmentation, perforation or patterning may serve as an alternative parameter to modulating bar width to control the scattering strength of unit call. Such a parameter may be substituted for wt of the top bar width or wb of bottom bar width in the grating coupler designs provided here. Either the top, bottom or both sets of bars may include some transverse segmentation, perforation or patterning.

The array of grating bars with associated polarization currents (currents due to perturbation of a guided wave by index changes that change a uniform waveguide cross-section into the grating) acts like a phased array antenna and radiates in the direction in which the elements are in phase. In a conventional grating coupler patterned in a single device layer with symmetry about a plane passing through the plane of the waveguide circuit, the grating radiation pattern is exactly symmetric for output radiation into the up and down directions perpendicular to a plane of the grating bars and the waveguide circuit. Even for a grating coupler that does not have a perfect symmetry about a plane passing through the plane of the waveguide circuit, but is patterned by a single mask, often there is likewise approximately a symmetric radiation pattern, depending on the material layer stack. This symmetry limits efficiency of radiating into one beam above or below the chip to about 50% (−3 dB), since the other 50% of incident power goes in the opposite direction. Another 1 dB of loss in uniformly periodic structures can be attributed to the mode mismatch between the exponential radiated field and the Gaussian fiber mode or other target beam shape. To break this up/down symmetry, previous work has used various approaches including metallic or dielectric stack mirrors integrated into the device, and required additional processing steps to be integrated into the photonic chip, or required more expensive, custom specialty silicon and/or silicon-on-insulator wafers with dielectric mirrors, which add to processing costs and complexity.

An exemplary embodiment of a prior art structure that has approximately symmetric radiation pattern, and thus shows poor directivity is illustrated in FIG. 4. Such gratings typically offer fiber-chip coupling loss of 3-4 dB at the design wavelength. In FIG. 4, a single silicon waveguide-core layer 120 is illustrated having a grating of partial-thickness cuts 122 formed into its upper surface. Partial-thickness cuts, whether in an arbitrary dielectric (e.g. silicon nitride), polysilicon or crystalline silicon device layers such as silicon photonic waveguide cores or active transistor layers sometimes also utilized as waveguide core material, require additional processing steps and complexity including usually a timed etch. In particular, partial etch steps are not supported in standard CMOS or CMOS-SOI processing. Thus, a design not requiring partial etches is additionally advantageous for monolithic CMOS and CMOS-SOI integration, and provides more robust designs in other platforms because it does not rely on the accuracy of realization of a partial etch depth.

In general, grating couplers disclosed herein comprise a grating coupler structure comprising an array of scattering unit cells, a waveguide port, and a beam port. The waveguide port is in-plane and typically formed in one or more of the device layers used to form the grating coupler structure, and can be used as an input or output. The beam port is above the grating coupler for devices designed to couple to upward radiation, and below the grating coupler for devices designed to couple to downward radiation. The beam port may interface with an optical fiber mode of an abutted optical fiber or fiber array, or may be an optical beam mode that traverses a distance in air or background materials prior to coupling to an optical fiber or interfacing to another optical device.

Figure 10:
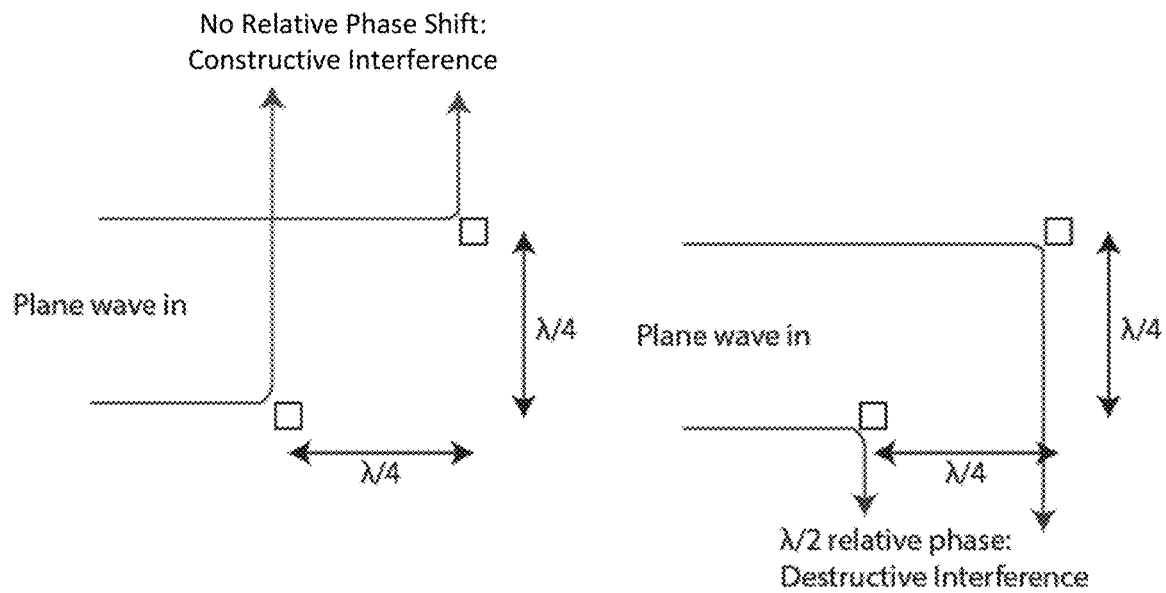
FIG. 10 illustrates how constructive interference in a two-element scattering unit can direct power up, while destructive interference ensures that little or none is radiated down.
Figure 9:
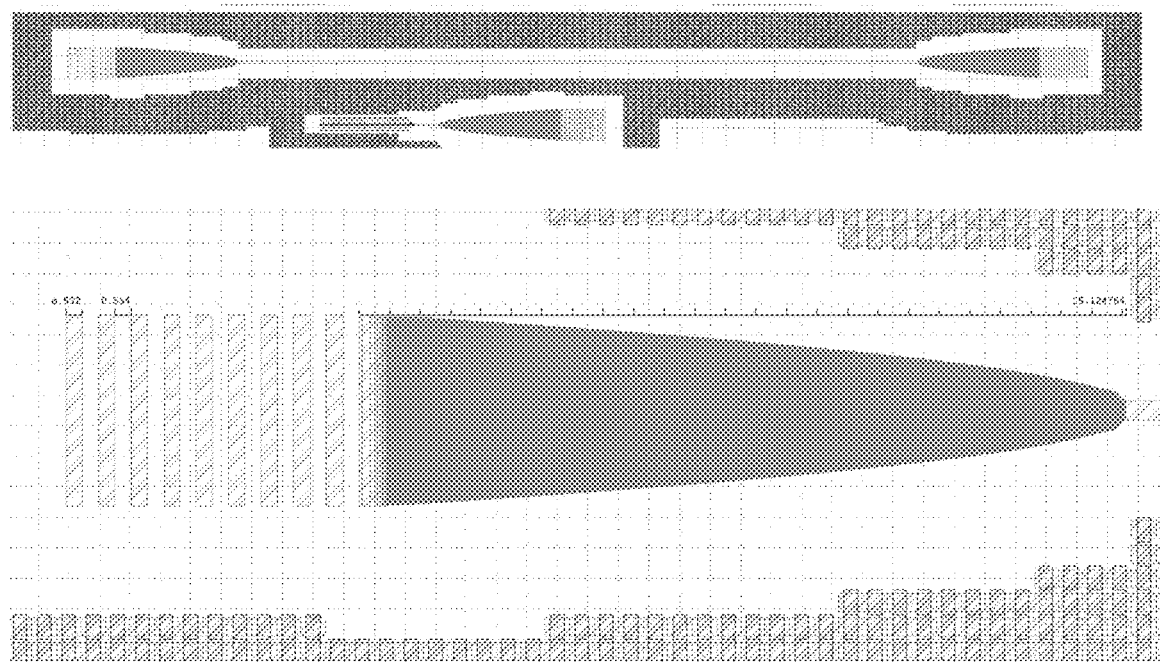
FIG. 9 shows an example top view chip layout of a grating coupler which does not use transverse segmentation in the waveguide taper section.

In an embodiment of the invention, we replace each element of the grating by a pair of "scatterers", the two scatterers forming a unit cell and the unit cells forming an array that may be periodic, quasi-periodic or not periodic. We first consider the case of a periodic array, although the inventive embodiments specifically call for an aperiodic array. We consider the periodic array, because the properties of a single unit call can be understood by considering it as part of an infinite array—and those properties utilized to synthesize an optimal aperiodic array. Thus, we break the design into two parts—an array pattern (periodic array) and an element pattern (the two scatterers inside a single unit cell). The radiation from the complete periodic array of such unit cells can be thought of as the multiplication of these two radiation patterns (radiation vs. angle) or convolution in space. The unit cell is shown in FIG. 10, where the two weak scatterers are separated in a quarter wavelength (effective wavelength in the heterogeneous medium of scatterer material and background material(s)) in both the horizontal (co-planar with multiple scatterers in the same material layer) and vertical (perpendicular to the plane defined by multiple scatterers in the same material layer) directions. Then, when a plane wave is incident from the left (FIG. 10), scattered light coherently adds in the up direction, and destructively interferes in the down direction. Thus, we obtain an element pattern with little or no light radiated in a downward direction. Since the linear array pattern will have two main lobes of interest symmetrically about the plane in which the array lies (one in each of the upward and downward directions, at an angle off-normal selected by design), ideally the element null in the downward direction will be in the direction of the main lobe for an upward radiating design. Thus, it cancels the (e.g.) downward radiation and allows only upward radiation. The converse also works, where the element pattern nulls out the upward main lobe, thus favoring downward radiation. We have used this to show nearly 100% directivity in designs using only a pair of patternable device layers.

Similar structures can be made to operate with vertical spacing other than a quarter wavelength vertical spacing between the two layers of weak scatterers, however other design parameters, including horizontal offset between shapes of the two layers, may require adjustment for appropriate function. Here, the quarter wavelength spacing refers to the wavelength in the medium, equal to the free-space wavelength divided by the refractive index. In a weakly scattering structure, the refractive index of the background medium or material stack and scatterers may be similar so this wavelength in the medium is well defined. In the case of strong scatterers, the refractive index of the scatterers and the background medium or materials in a background material stack, may differ substantially, i.e. have high index contrast. Low index contrast (weak scattering) may be considered <1% index change. High index contrast refers to refractive index differences between one index and another that represent small turn radii for waveguides, and tight confinement in the cross-section on the sub-wavelength scale of the wavelength in the core material. Material system examples include silicon nitride (SiN) core with silica cladding (n=1.9 or 2.4 core and n=1.45 cladding), silicon with silica (3.5:1.45) or silicon nitride (3.5:2.0) cladding. In other words, high index contrast typically refers to 10% or greater difference between refractive indices and often 50-200% relative index difference. (For purposes of our designs we will further restrict this definition, below.) In this case, the wavelength in the medium inside the grating is not well defined. An approximation can be made by taking an average permittivity (square index) of the medium, weighted by the electric field distribution (index where light is thereby having higher weighting). However, such approximations will in general provide approximations. Nevertheless, the vertical spacing of an "effective" quarter wavelength is what defines the vertical distance between the two patternable device layers, and is on the order of the wavelength or less. In such a particular embodiment, vertical spacing between the scatterers is less than one wavelength $\lambda$ of the light.

Because our designs also require scatterers in the vertical direction spaced by an effective quarter wavelength, and hence waveguides with approximately a critical angle of the waves inside the core above 45 degrees to allow similar horizontal and vertical length scales for interference, this limits the refractive index contrast of interest further. With critical angle for optical reflection under oblique incidence defined as $\theta_c=\arcsin(n_{cladding}/n_{core})$ with ncore and ncladding the high and low refractive indices of the waveguide wall, for a 45° angle, an index contrast ncore/ncladding above 1.41, or above 41% is needed. Thus, for a silica cladding of 1.45, core indices above ncore=1.45×1.41=2.05 are preferable for the grating formation. Furthermore, since a grating is partially core material and partially cladding, there is also low index cladding material, which suggests even higher preferable core indices. The guided waveguide mode at the grating coupler input and within the grating may also need to be considerably below the critical angle to provide strong confinement, another reason to aim for core materials that provide even higher critical angle, i.e. index. This means preferable materials for the two layers are silicon (crystalline or polycrystalline), and potentially high index dielectrics such as silicon rich silicon nitride and silicon carbide that can have index as high as 2.4, and III-V materials. Materials with lower core index may provide some aspects of the suggested functions but at reduced performance. Hence, by high index and high index contrast we will typically refer to materials above 2.05 to 2.4 refractive index, and more preferably above 2.4, when surrounded by silica cladding (n=1.45), and corresponding fractional index contrasts in other material backgrounds.

Efficient Couplers

However, this does not solve the problem of forming a Gaussian beam at the same time as ensuring directional radiation. The challenge is nontrivial because beamforming—whether a Gaussian beam or another desired beam shape—requires control by design of the scattering strength of the elements of the grating array along the array as a function of position. Gratings that radiate in a single direction, and change strength along the propagation direction without altering the angle of radiation, are nontrivial to design. State of the art techniques involve using brute force global optimization, such as genetic algorithms. These techniques require large computational power, and have yielded couplers with efficiency limited to 1 to 2 dB even in the best cases reported, obtained after years of improvements, and worse (3-5 dB) in common use in silicon photonics.

If one is to approach 100% efficiency, and combat both the directionality and the mode matching problem simultaneously, it is necessary to create a "tapered grating" structure that can emit a tailored (e.g. Gaussian) beam shape, but also employs the unidirectional element designs in FIG. 10. This means, in the ideal scenario, varying scattering strength, while simultaneously maintaining a fixed output radiation angle, and high directivity. To reduce scattering strength, the scatterers may be reduced in size. To maintain radiation direction, their relative position (owing to changes in effective index that come from their change in size) must change. To maintain directivity, likewise their relative position must maintain an element pattern null on the undesired array main lobe direction. In general there are many degrees of freedom in design, 3, 4 or more per unit cell, times the number of unit cells since the grating is not uniform. These degrees of freedom include thicknesses of each of the silicon layers, (vertical) layer spacing, widths of upper and lower scattering elements in each unit cell, the offsets of upper relative to lower scattering elements in each unit cell, and local pitch of the unit cells (i.e. full width of each unit cell). A second common-mode offset of the upper and lower scattering elements in the horizontal direction relative to the unit cell may also be utilized.

We provide herein a rigorous, systematic approach and designs of high efficiency couplers that accomplish these requirements.

Figure 11A:
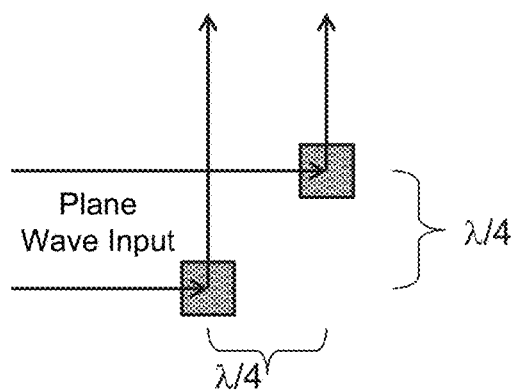
FIGS. 11A, 11B, 11C, and 11D illustrates directional radiation from a two-scatterer unit cell with quarter-wavelength spacing in the vertical and horizontal direction, the scatterers being positive refractive index perturbations.
Figure 11B:
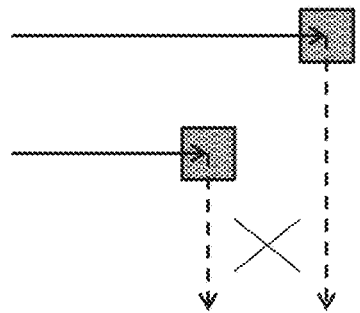
Figure 11C:
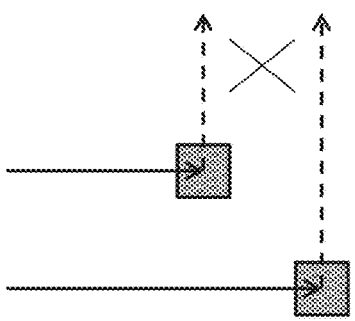
Figure 11D:
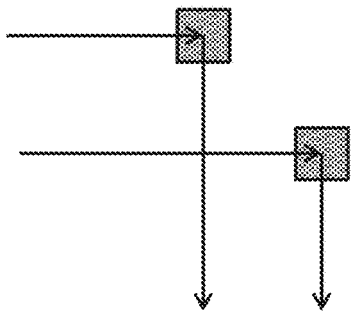
Figure 12A:
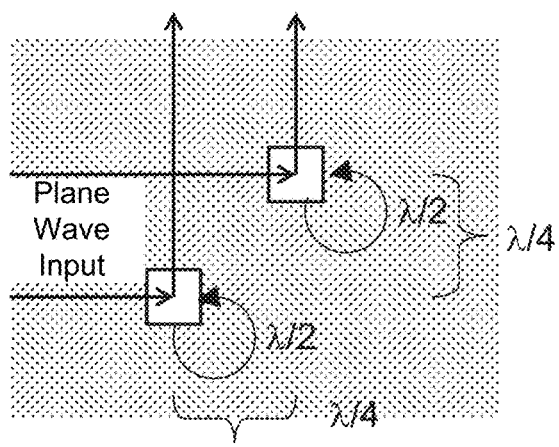
FIGS. 12A, 12B, 12C, and 12D illustrates directional radiation from a two-scatterer unit cell with quarter-wavelength spacing in the vertical and horizontal direction, the scatterers being negative refractive index perturbations.
Figure 12C:
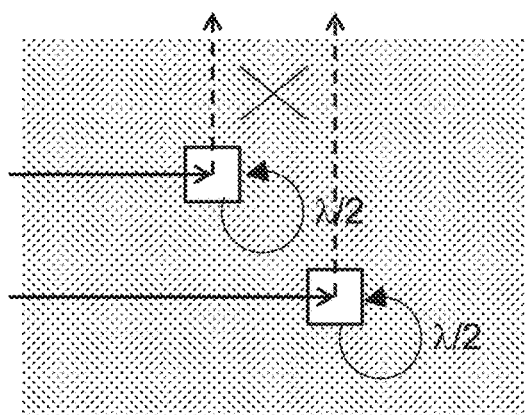
Figure 12B:
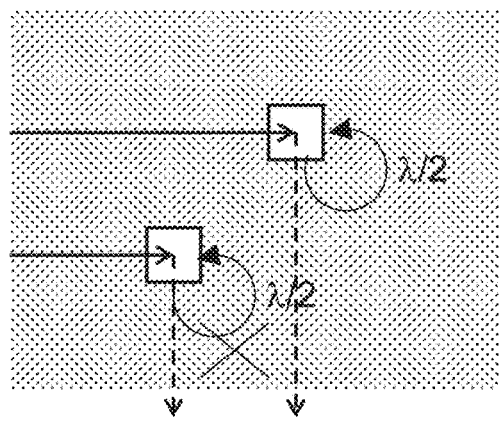
Figure 12D:
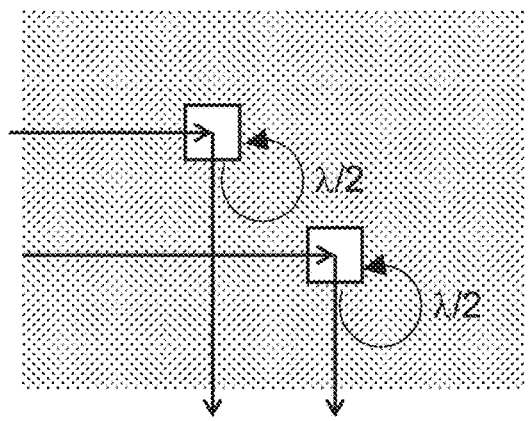

Before we consider this design method for high efficiency couplers, we illustrate three different situations of scatterers, which provide novel grating coupler designs, i.e. embodiments of the invention. In FIG. 11A-D, we show scatterers that have a higher refractive index (dark blocks) than the background material. Thus, after scattering there is no phase shift (aside from the 90 degree phase due to the polarization current term that is always present). Thus, in FIGS. 11A and 11B, an exemplary plane wave incident from the left produces scattering that constructively interferes up (FIG. 11A), and destructively downward (FIG. 11B). If we switch the order of the scatterers in this grating unit cell cross-section in relation to the input port, as in FIG. 11C and FIG. 11D, then the radiation now interferes constructively down (FIG. 11D) and destructively up (FIG. 11D). Thus, construction according to FIGS. 11A and 11B gives an upward radiating grating coupler, while FIGS. 11C and 11D gives a downward radiating one, simply by placing the top element behind or in front of the bottom element with respect to the input port.

In a second situation (FIG. 12), if the scatterers are lower refractive index (white blocks) than the background material, the same happens because each scatterer now provides a 180 degree phase shift upon reradiation (radiation off the scatterers), but since all scatterers do the same, the radiation pattern is the same and there is just an overall 180 degree phase delay/advance in the wave.

Figure 13A:
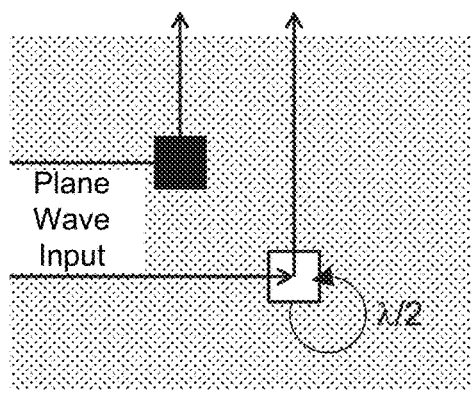
FIGS. 13A-D illustrates directional radiation from a two-scatterer unit cell with quarter-wavelength spacing in the vertical and horizontal direction, and one scatterer being a positive index perturbation while the other scatterer being a negative index perturbation.
Figure 13B:
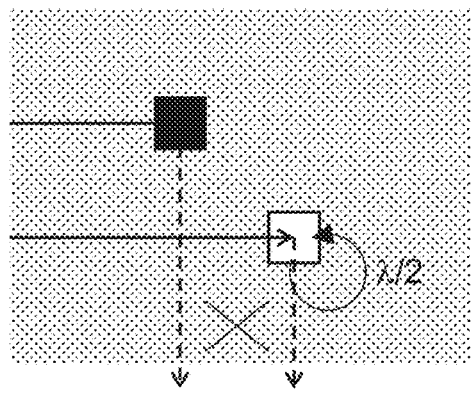
Figure 13C:
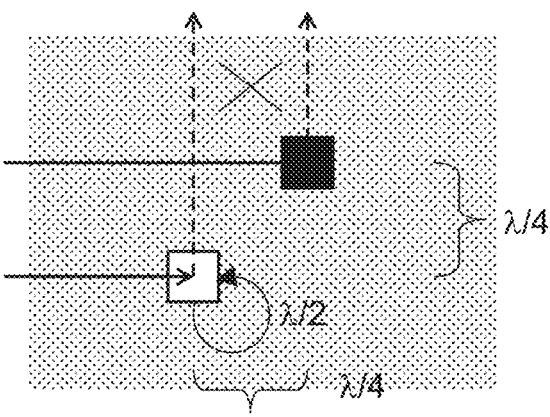
Figure 13D:
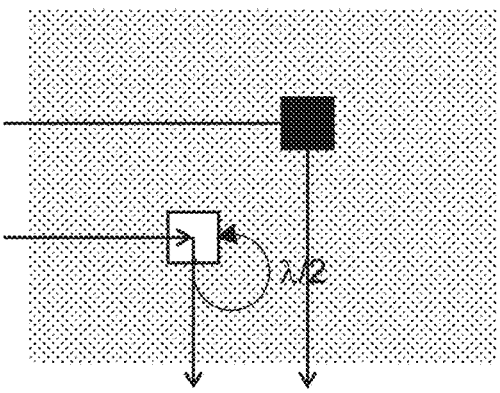

In a third situation (FIG. 13A-E), one scatterer in the unit cell has a higher refractive index than background, and the other a lower one. In this case, the radiation direction changes from up to down or the reverse, because only one element gives an extra 180 degree phase shift to the radiation it scatters, so the direction that previously had constructive interference now has destructive, and the direction that was previously destructively interfering is now constructively interfering. Thus, FIGS. 13C and 13D show that the same scatterer orientation provides radiation down whereas FIGS. 11A, 11B, 12A, and 12B provided radiation up, and FIGS. 11C, 11D, 12C, and 12D the converse with radiation down.

In general, scatterers are perturbations, so if the grating unit cell, in comparison to the unperturbed waveguide, has a region of material where index is increased, such as a region of oxide in the waveguide changed to silicon, showing as an extra thickness of silicon material on top of the waveguide forming a grating, this is a positive index perturbation, and another region where index is decreased, such as an etched out silicon trench replaced by silica, the index perturbation is negative. We will employ these guidelines to provide efficient designs of simultaneously unidirectional and beamforming (i.e. custom beam shape) couplers for different waveguide geometries.

Figure 1:
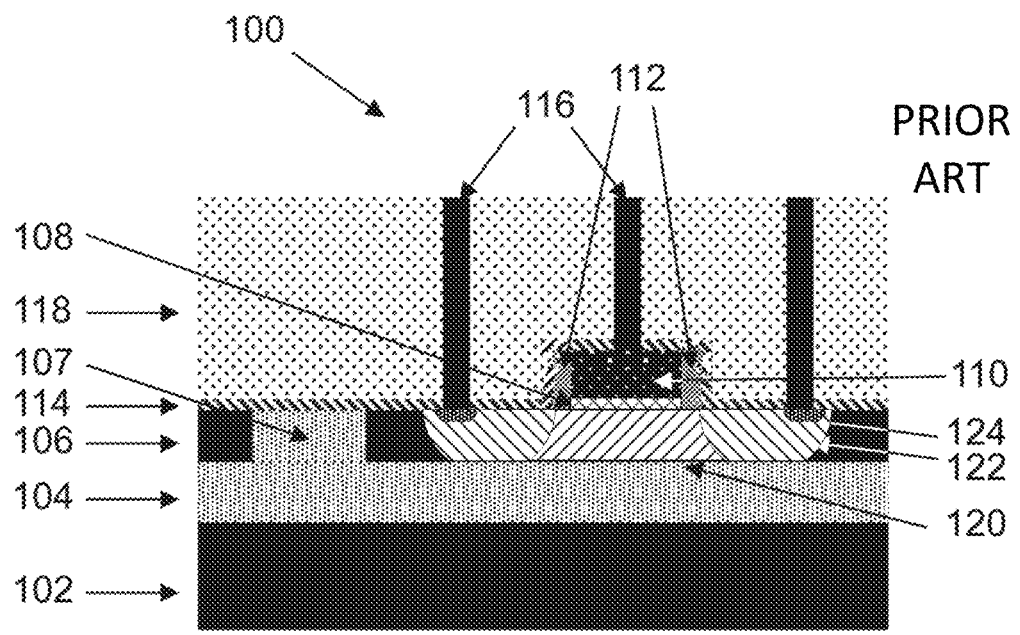
FIG. 1 is a schematic cross section diagram of a PRIOR ART device produced using a modern CMOS SOI process, including a MOSFET transistor cross-section.
Figure 2:
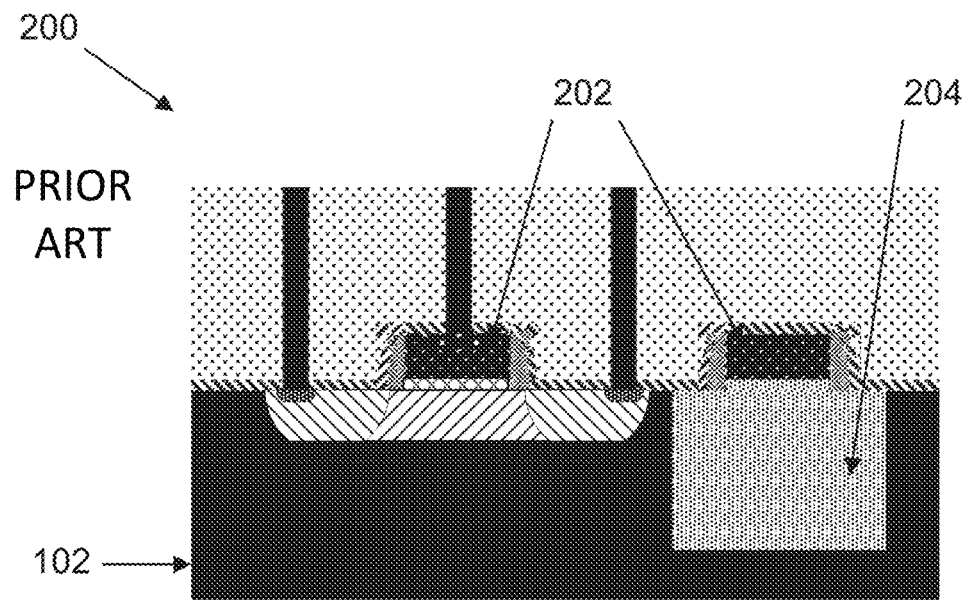
FIG. 2 is a schematic cross section of a PRIOR ART device produced with a modern bulk CMOS fabrication process including a MOSFET transistor cross-section.

This document describes on-chip, waveguide excited, out-of-plane beam formers that are formed from two device layers. These may be silicon, or another material or combination of materials. The key property is that they provide scattering that is controllable by design from one unit cell to another. Since silicon has a high refractive index and scatters strongly when surrounded by silica, and is a common photonic integrated circuit material, we use it as the example system. To form the directional array element, we utilize two patterned device layers. This is commonly present in CMOS SOI electronics processes, as shown in FIG. 1, using the gate and body layers of the transistor; and in certain silicon photonics processes (e.g. IMEC's ISIPP50G silicon photonics process supports a polysilicon device layer atop a crystalline silicon device layer, although they are at present not independently patternable). We form a unit cell of the grating from a patterned shape in each of the two device layers, which we will call the top and bottom silicon layers. The patterned shapes in the top and bottom silicon layers we will refer to as the top and bottom silicon shapes. More generally, any two high refractive index materials relative to the surrounding background index may be used for the top and bottom device layers, and the top and bottom high-index shapes, per our previous guidelines on what constitutes high refractive index contrast. In CMOS SOI technology, one may use the polycrystalline gate silicon layer and the crystalline transistor body silicon layer. We note that device layer thicknesses and vertical spacing of the device layers is a single set of three parameters that is typically shared by all unit cells, and patterning of lateral dimensions allows cell to cell variation by design. To design the grating, we need to control the scattering strength of each of the top and bottom silicon shapes, their relative spacing (offset), and the local periodicity of the (usually smoothly) varying grating structure. The "joint scattering strength", or total radiation of the upper and lower scattering elements in each unit cell, determines the local radiation strength of the unit cell of the grating. The top shape and bottom shape are adjusted, e.g. in width, to control effective scattering strength of each, and their strength difference is adjusted to perfectly null radiation in a certain direction. Their relative position offset in part controls that direction. Finally the local period (width of the unit cell) controls the direction of the main (wanted) beam of radiation—due to the array pattern. This picture provides an intuitive explanation, but is based on perturbation theory that assumes small perturbations. In high index contrast, such as silicon photonics, rigorous numerical simulations are required to find the dimensions needed to accomplish these goals. This is needed for reasons that include that high index contrast necessitates accounting for multiple scattering, i.e. scattering off a first element which then scatters off a second (and possibly back, etc.), while weak scattering, which is where perturbation theory is valid, nominally disregards of such higher order effects.

In embodiments presented here, two high index material layers of similar refractive index and thickness are used (both silicon, both 50-100 nm thick in the present example), in order to allow equal scattering from the two shapes in the unit cell—one in each of the top and bottom layers—the equal scattering permitting destructive interference and thus high directivity of a unit cell. Material layers of lower refractive index than silicon may be used, but high index well above 2.05-2.4 is needed for high performance due to the quarter-wave interference in both directions. Different refractive indices of the two material layers may be utilized, and compensated by differences in thickness. However, materials of too low a refractive index will result in low directivity. Using two silicon layers, we show directivities of unit cells up to 10000:1 (FIG. 15B, 15F), several orders of magnitude higher than previously demonstrated.

FIG. 14B shows an example embodiment of the invention, a schematic cross section of a grating with three full unit cells. This particular structure is envisioned as being fabricated in a CMOS SOI process, with 2 silicon layers (shown in black) serving as scatterers. After the material stack—including layer thicknesses and material properties including refractive indices—is chosen for the entire structure (common to all unit cells), there are 4 degrees of freedom that control lithographically each unit cell—the widths of the top and bottom silicon shapes of the unit cell, their relative translation or offset, and the unit cell size, i.e. local width or period $\Lambda$ of the structure. In lieu of widths of top and bottom silicon shapes, or in addition, the shapes may be segmented, perforated or patterned in the direction transverse to the input waveguide (i.e. out of plane to the cross-section, such as FIG. 14B).

A Gaussian desired profile (or another desired beam shape) (Taillaert, Peter Bienstman, and Roel Baets, "Compact efficient broadband grating coupler for silicon-on-insulator waveguides," Opt. Lett. 29, 2749-2751 (2004)), provides the desired scattering strength $\alpha(x)$ vs. position along the grating. The designer's job is to find the 4 parameters above for each unit cell to realize that scattering strength distribution to the degree possible, while maintaining the radiation angle and high directivity.

In one embodiment of the invention, we provide a grating coupler formed by two device layers, each device layer defining scatterers as shown in FIG. 14B in each unit cell, where the grating coupler's 4 unit cell parameters are tapered so that the scattering strength forms a Gaussian beam, or desired beam shape, but a high directionality is maintained at all times within the grating by design of the local unit cell. For grating couplers intended to emit planar phase front beams, such as for near fiber to chip coupling, the unit cells also maintain a constant angle of emission. For emission of a focusing or defocusing beam, the angle of emission is tapered along the grating to engineer the emission phase front in addition to the intensity profile. The direction transverse to the input waveguide in the plane of the device layer, i.e. out of plane of the cross-section such as FIG. 14B, provides a transverse beam shape that is roughly the shape of the input waveguide mode entering the grating, or approximately the width of the grating at a point along the grating where scattering out of radiation is highest, i.e. the peak power emissions point and beam center. This beam shape typically has a good match to a Gaussian beam (a typical number is 98%), and incurs minimal mismatch loss (~0.1 dB). Finally, any air-silica interfaces in matching to fiber can be alleviated using index matching fluid to fill gaps, as is done in some other fiber mating approaches.

Beam Parameters

For Gaussian beams, beam power drops off to each side of a central beam axis. For purposes of this document, Mode Field Diameter (MFD) is, for a Gaussian beam, the width between two points on opposite sides of the beam axis at which electric field strength of the beam drops from a central peak-power value to 1/e times the peak power value. The beam angle $\theta$ is the angle, relative to a perpendicular to the plane defined by the scatterers, at which the central beam axis leaves the coupler. The point at which the central beam axis intersects the plane defined by the scatterers of a grating coupler is the peak power emissions point of the grating coupler. The beam angle $\theta$ is positive if the beam axis leaves the coupler upward or downward heading away from the input waveguide; negative if the beam axis leaves the coupler upward or downward heading toward the input waveguide; and zero if the beam is surface normal.

In a focusing-beam embodiment, portions of the coupler adjacent the waveguide have a beam angle $\theta 1$ greater than one and approximately two degrees different than the beam angle $\theta 2$ of portions of the coupler furthest from the waveguide to produce a converging beam that can, in principle, focus on an end of an optical fiber, another coupler, or on a fixed point in space above/below the grating surface. In a particular focusing-beam embodiment, a third cell at the coupler center has a nominal beam angle midway between $\theta 1$ and $\theta 2$ with a uniform tapering of nominal beam angle across the coupler. Such an embodiment may produce a focusing shaped beam, such as a Gaussian beam, by having the third cell provide stronger scattering than a first and a second unit cell that are in the portions with beam angle $\theta 1$ and beam angle $\theta 2$, respectively. This is in addition to providing the third unit cell with high directivity, along with high directivity in the portions with beam angle $\theta 1$ and beam angle $\theta 2$.

Designing the Grating

A method for synthesizing a structure that emits a simultaneously unidirectional and tailored beam shape beam (in particular, e.g. Gaussian) consists of the following. We use a rigorous photonic band structure solver that is capable of taking in a real frequency (corresponding to a free-space wavelength) and outputting a complex-propagation-constant (momentum) eigenvalue. The solver must support radiation absorbing boundary conditions (one option being perfectly matched layers). A suitable band structure solver has been reported in *Finite-difference complex-wavevector band structure solver for analysis and design of periodic radiative microphotonic structures* by Jelena Notaros and Miloš A. Popović, Optics Letters, Mar. 15, 2015/Vol. 40, No. 6. This solver is based on a finite-difference method on a split Yee grid. Input to the solver is a description of the structure to be simulated (refractive index distribution of the cross-section of a unit cell, and frequency i.e. free-space wavelength of operation) and output is the complex wavevector and field distribution in the unit cell. Notably, modes are computed even in bandgaps, which traditional band solvers, with wavevector input, exclude. This is one possible solver, and other types can be utilized that provide the same or similar information, including the type described in G. Lecamp, J. P. Hugonin, and P. Lalanne, "*Theoretical and computational concepts for periodic optical waveguides*," Opt. Express 15, 11042-11060 (2007). Since these solvers use Bloch-Floquet type boundary conditions to solve Maxwell's equations over a unit cell of the structure in order to solve for optical modes of periodic structures, they may be referred to as Bloch mode solvers.

To set the stage for a design, the target operating wavelength, material stack including layer thicknesses and refractive indices at the target wavelength, output beam angle, and desired direction of exiting beam (up or down), are selected. A variable unit cell with four parameters is chosen that vary the scattering strength of the top and bottom shape, their offset (wo) and the local period $\Lambda$ (which is equivalent to unit cell width, but corresponds to period in a special case when unit cells are identical and the array is periodic). In this example, we select only silicon shape width control for the top (wt) and bottom (wb) shape scattering strength design, but other options are possible as described elsewhere in this disclosure.

The band solver is used to compute the scattering strength, a, the directionality, D (a ratio of power radiated up divided by power radiated down), and primary off-normal output radiation angle, $\theta$, in a unit cell. We obtain these three variables as a h directivities function of the 4-dimensional space ($w_t$, $w_b$, $w_o$ and $\Lambda$; see FIG. 14B), storing them in a 4D database for a practical range of values for each of the 4 parameters $w_t$, $w_b$, $w_o$ and $\Lambda$. Our approach is to first choose a target output beam angle for the coupler design, and eliminate all points in the 4D database that do not provide that angle. This reduces the design space to 3 dimensional, and the period $\Lambda$ can now be a dependent parameter, i.e. it can be computed for any choice of the other 3 parameters such that the angle is the target beam angle. Next, for each $w_t$ and $w_b$, we choose that offset $w_o$ which maximizes the directionality D of the unit cell. Directionality D is defined as the ratio of radiated power up and radiated power down from the unit cell. Radiated power up is the total Poynting power flux (in watts for a 3D unit cell or watts/m for a 2D unit cell) in the upward direction across the top surface of the unit cell, while radiated power down is the total Poynting power flux in the downward direction across the bottom surface of the unit cell. Directivity D is maximized in the selected beam emission direction per specification. For each set of wt and wb, a particular wo provides the highest D, and now we are left with a 2 dimensional space (wt and wb). For a more natural representation of the data, in our synthesis method, we then recast $w_t$ and $w_b$ in terms of a fill factor, $f=w_b/\Lambda$, and a ratio of layer widths, $r=w_t/w_b$. We can now plot the radiation strength and the directivity vs. the remaining two parameters, f and r (FIGS. 15A, 15B, 15E, and 15F). We note that D for a particular unit cell may reach 10000 (10000:1) in parts of the plot showing very high D but D's in the 10 to 1000 range also may also provide good performance. Therefore, although optimum directivity is obtained along the white contours indicated in FIGS. 15E,-15H for this example, there is a large area of FIG. 15B and FIG. 15F that provides directivity above 1000 and an even larger one above 100. Thus significant latitude is permitted in design. However, a chosen contour in FIG. 15B determines a one-dimensional line along which wt and wb are chosen to obtain particular scattering strength $\alpha(x)$, and the corresponding wo and $\Lambda$ are predetermined (in FIGS. 15C/15G and 15D/15H, respectively). In most embodiments of the invention, D of a unit cell is greater than 10:1, that is 10 dB, but most designs reach 13-20 db (95:5 to 99:1) and the highest performance designs reach D's well above 1000:1 and up to above 10000:1 (see FIGS. 15B and 15F).

Such high directivities allow grating couplers with overall high device directivity to be achieved without the need to use bottom mirrors, or even small partial reflections off the buried oxide-silicon wafer interface, a common technique in silicon photonics to reflect additional light to constructively interfere with up radiated light and slightly improve efficiency. There are several downsides of such techniques. First, they are very sensitive on the thickness of the buried oxide separating the grating coupler device layer(s) and the silicon wafer. Since this thickness can be 2-3 microns, its uncertainty can be several 10's to 100 nm, which can provide significant inefficiency. Furthermore, if there is error in the grating coupler beam output angle due to in-plane dimensional fabrication variations (over/under etch, refractive index error, device layer thickness error, etc.), with a new output angle a bottom mirror approach can provide significant efficiency loss. Finally, there exist approaches to monolithic integration of silicon photonics with advanced CMOS node microelectronics (J. S. Orcutt, et al., "Open foundry platform for high-performance electronic-photonic integration," Opt. Express 20, 12222-12232 (2012)) that call for the removal of the silicon substrate in photonic device regions, and that may utilize grating couplers coupling light to fiber downward toward the substrate (i.e. in the direction where there used to be a substrate before removal). In this case, the partial mirror at the substrate interface lacks the silicon substrate and is weak (air-silica interface) or non-existent in the case index matching is used. Therefore, with high directivity unit cells with D>10 dB, and up to 20-40 dB as shown in FIGS. 15B and 15F, grating couplers can be designed that utilize only the device layers to achieve near unity coupling efficiency. The advantage is that patterning and thickness of device layers are among the best controlled steps in semiconductor fabrication processes, and can provide the benefit of robust realization of the design.

Figure 15E:
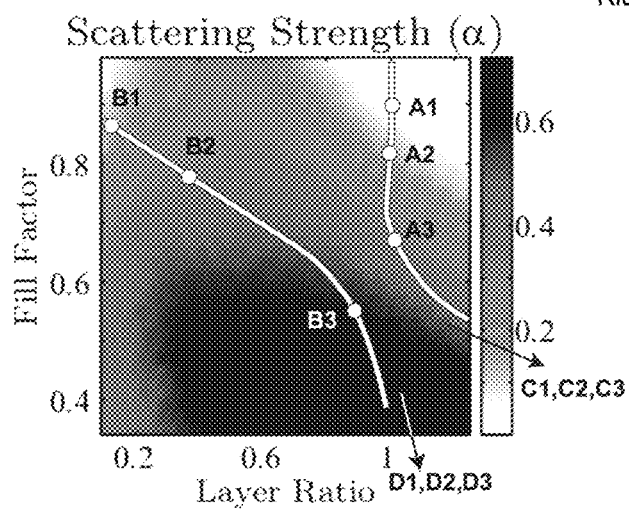
FIG. 15E shows the same information as FIG. 15A, with the addition of a white contour added to highlight the maximum directivity ridge for easy viewing, and exemplary design points A1-A3, B1-B3, C1-C3 and D1-D3 included.
Figure 15F:
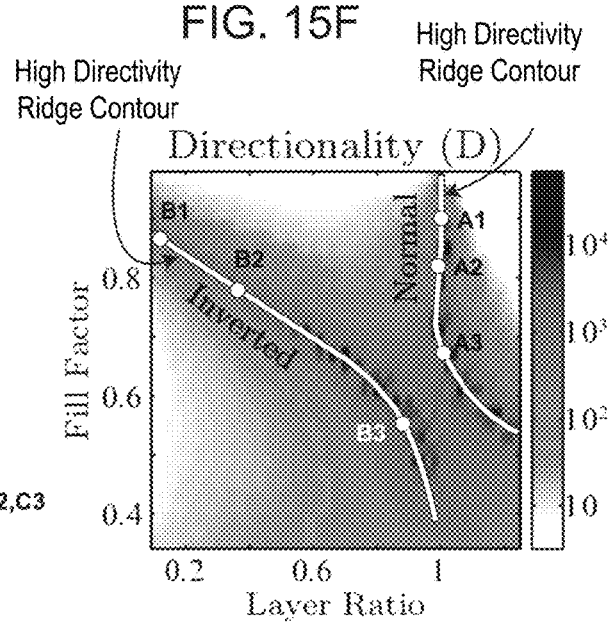
FIG. 15F shows the same information as FIG. 15B, with the addition of a white contour added to highlight the maximum directivity ridge for easy viewing.
Figure 19:
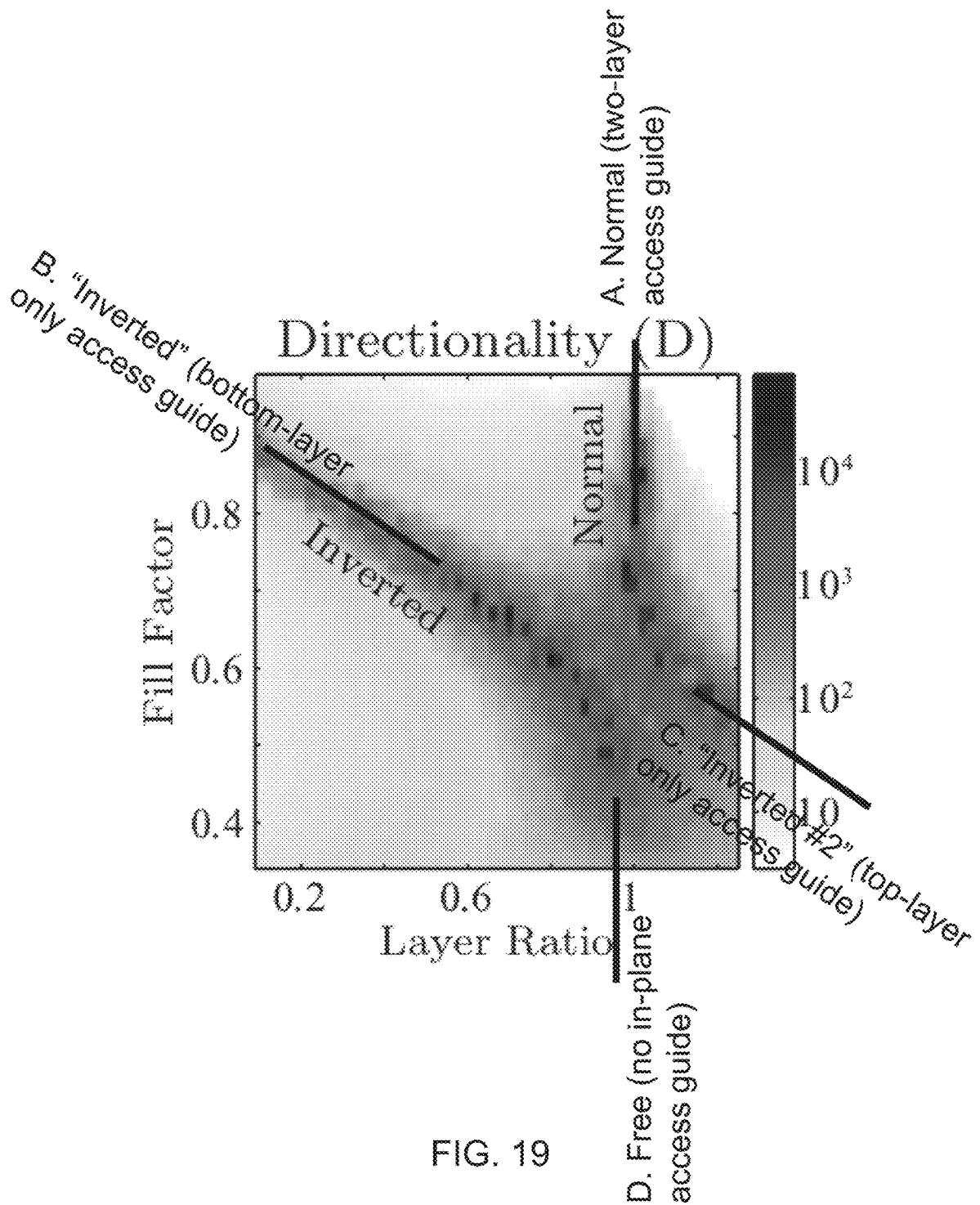
FIG. 19 shows the directivity of a unit cell plotted vs. layer ratio r=wt/wb, and fill factor f=wb/$\Lambda$, with period, $\Lambda$, and offset, wo, selected to fix the output angle at 20° and maximize directivity. Operating wavelength is 1200 nm in this example. Four fundamental types of grating coupler design are shown in this plot as four corners of an X shaped "directivity ridge". Note that a large region provides directivities D over 100 (i.e. 20 dB) and reaching as high as 10,000.
Figure 20:
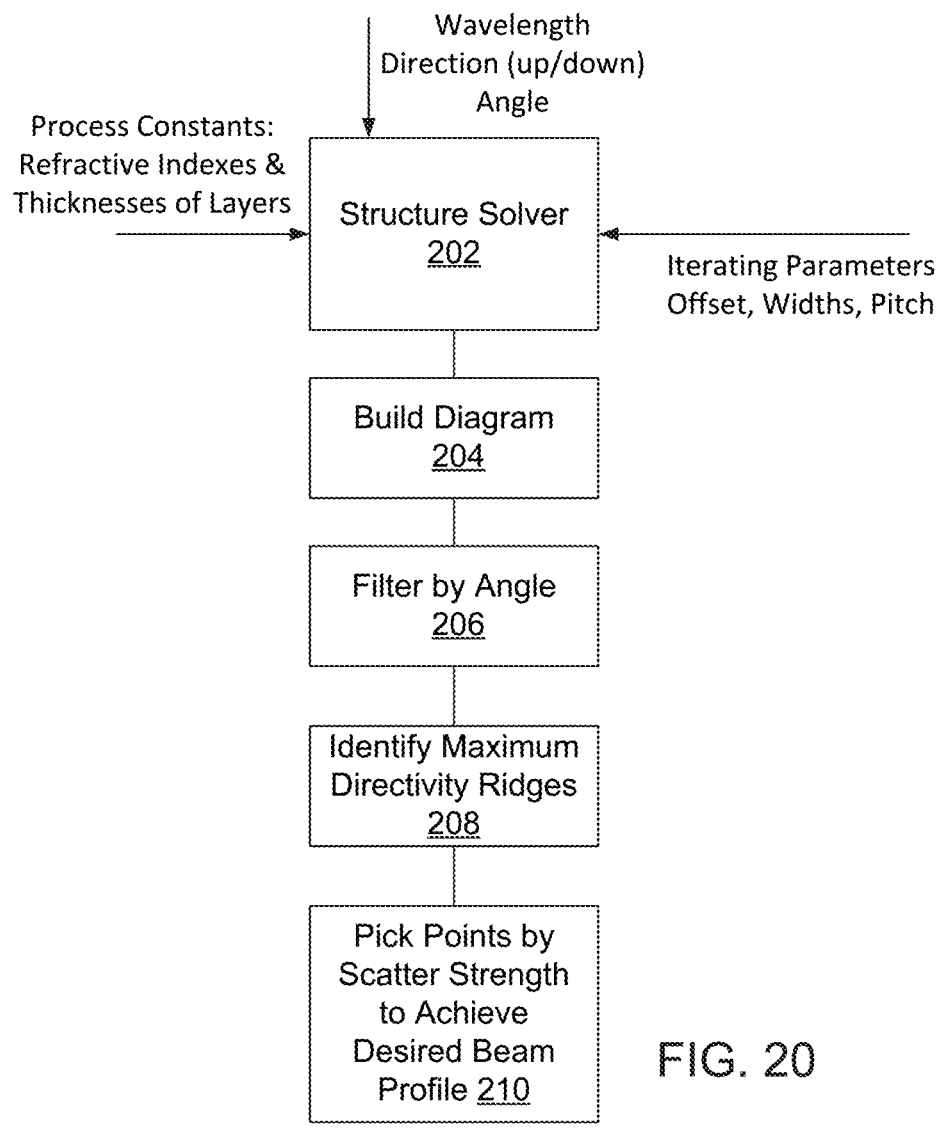
FIG. 20 is a simplified block diagram of a method for designing a grating coupler having high directivity.
Figure 21A:
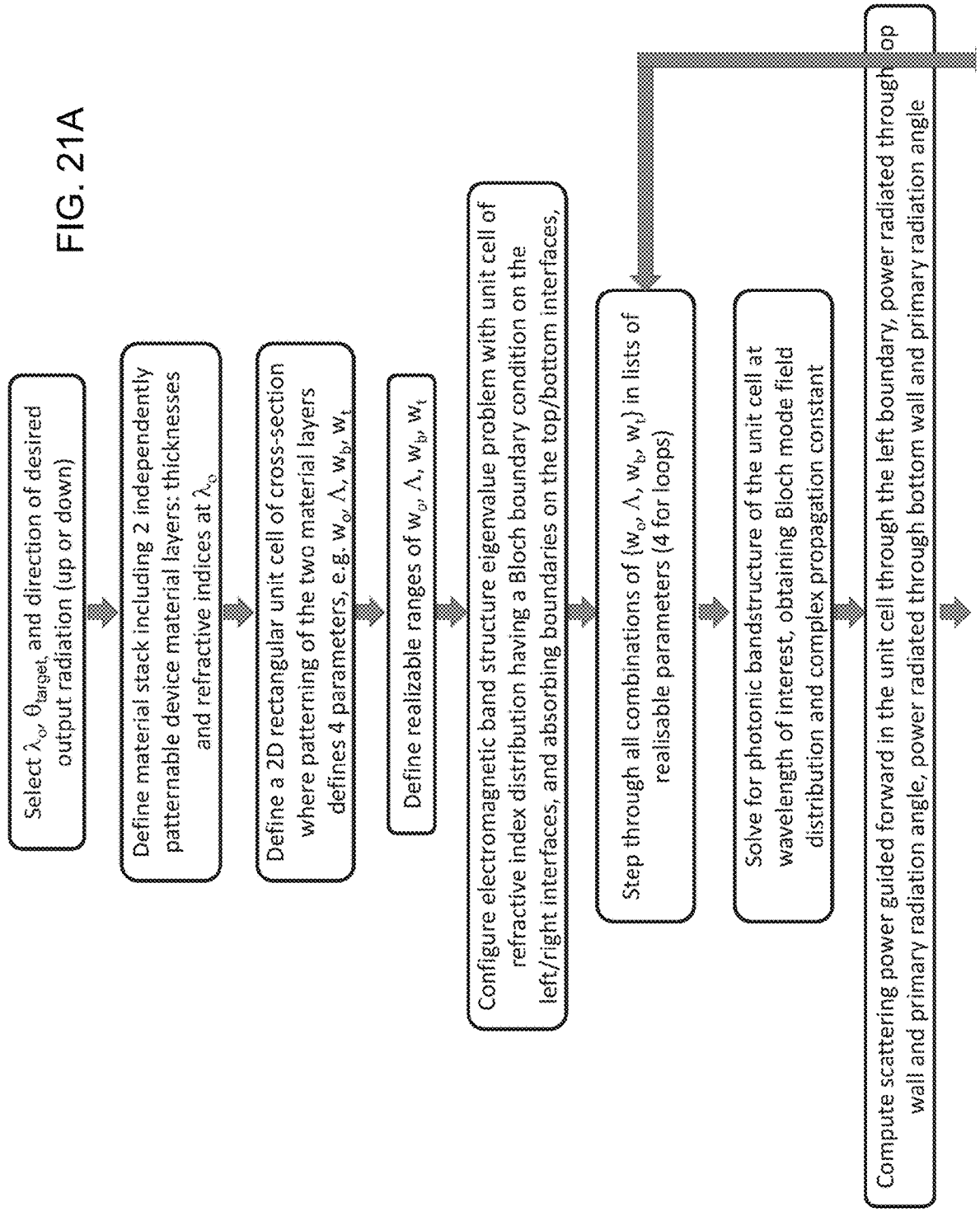
FIGS. 21A, 21B, and 21C together are a detailed block diagram of an alternative method for designing a grating coupler having high directivity.
Figure 21B:
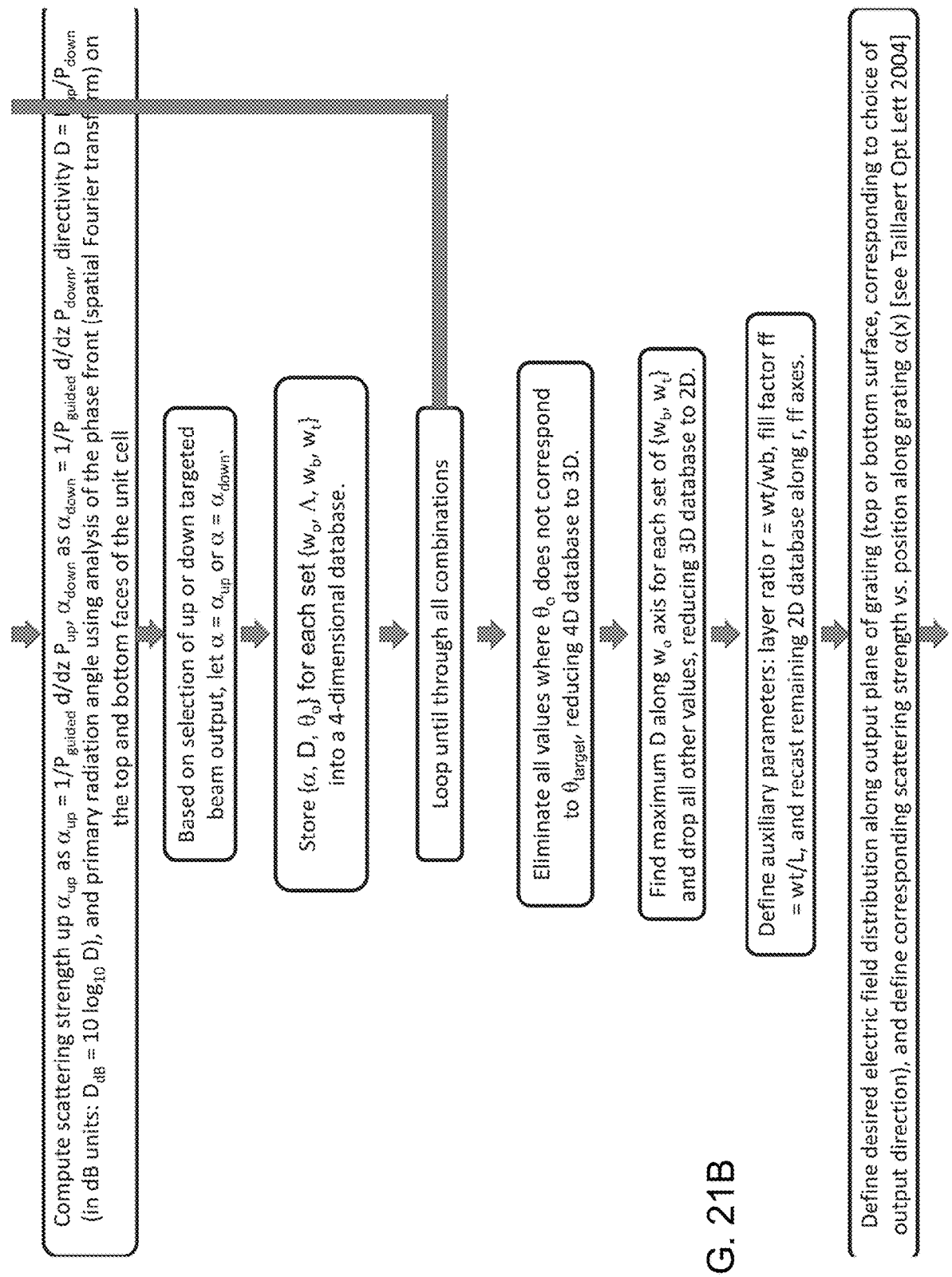
Figure 21C:
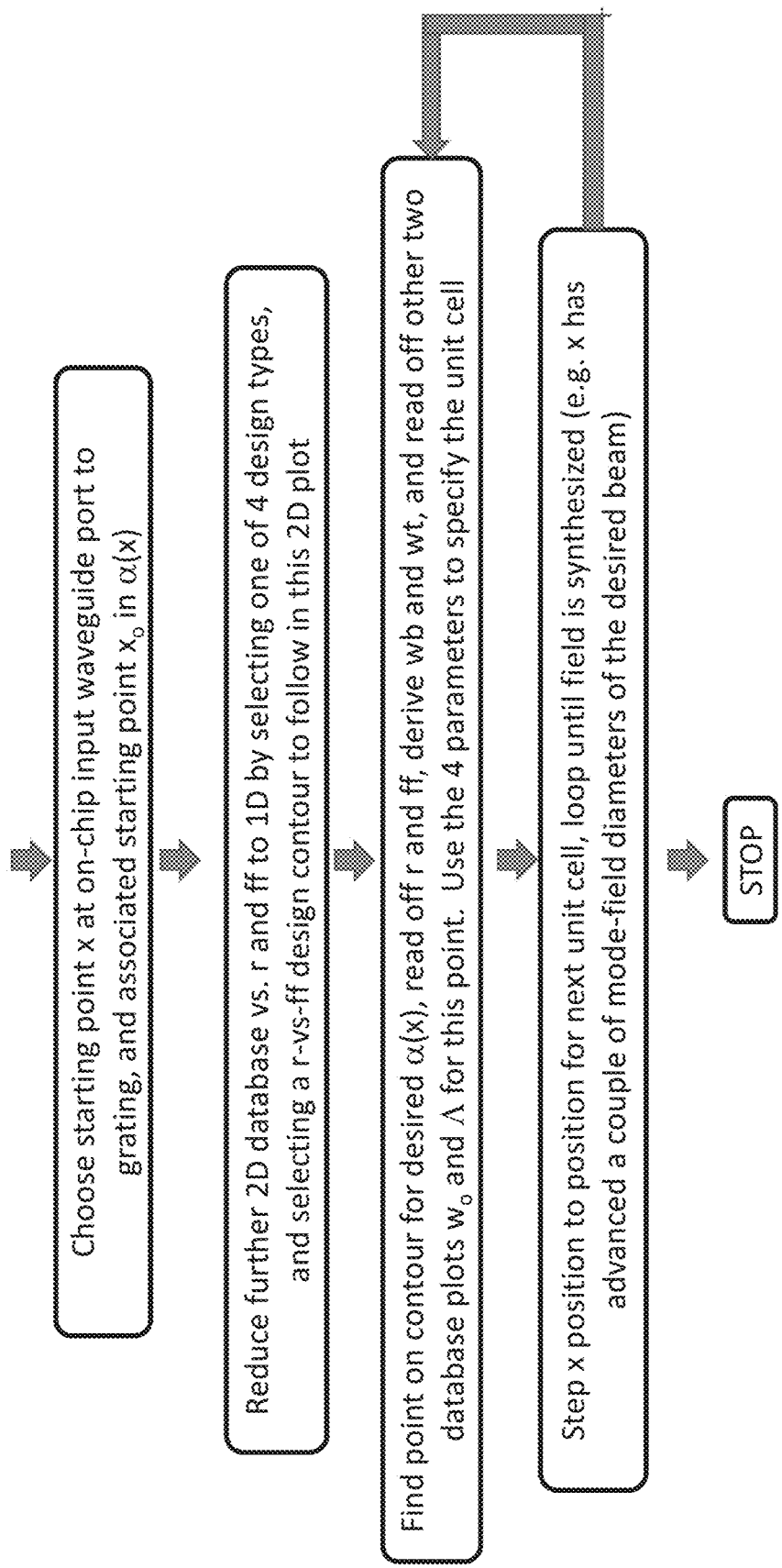

High directivity occurs in an approximately X shaped region in FIG. 15B (and, better shown in FIG. 19). The maximum directivity occurs along contour lines, marked by wide white contour lines on FIGS. 15E and 15F and by points A1-A3 and B1-B3, or the white contour lines and points A1-A3 and B1-B3 on FIGS. 15G and 15H. FIGS. 15A and 15E shows that scattering strength varies for different choices of r and f, i.e. wt and wb, along each contour line, while directivity is high and output angle is fixed. For any choice of r and f, wt and wb are directly computed, and FIGS. 15C, 15G 15D, and 15H provide the corresponding offset wo and period $\Lambda$, thus completely specifying the unit cell. Therefore, we can choose to use any part of the "X" shaped region providing a high enough directivity that spans all the scattering strength values needed to form a beam, e.g. the Gaussian in FIG. 14A, by selecting points along a contour in the X shaped region to produce desired emission strength at each point along the coupler. For the highest directivity, the white "high directivity ridge" contour as shown in FIGS. 15E-15H is used to select the scattering strength values.

Furthermore, the "high directivity ridge" contours in FIGS. 15E-15H show that there are four possible design types that allow a range of scattering parameters that will permit beam shape synthesis as desired. We call the top right and top left branches of the X shaped high directivity ridge, in FIGS. 15B and 15F, respectively the Type A: Normal designs and Type B: Inverted designs (see also FIG. 19). FIG. 19 shows there are in general four possible designs, the other two being Type C: Inverted #2 designs, and Type D: Free designs.

Referring to our discussion of types of pairs of perturbation in the unit cell in FIGS. 11A to 13D, we can classify these four types of designs by looking at the axes of the plot, which are "Layer ratio", r, and "Fill Factor", f Low fill factor f close to 0 means (since $f=wb/\Lambda$) we have a narrow silicon shape and thus mostly oxide in the bottom device layer rather than silicon; high fill factor f close to 1 means we have mostly silicon in the bottom layer (f=1 is an uninterrupted silicon waveguide in the bottom layer). A low ratio r means much smaller width top silicon layer shape than bottom layer shape, r close to 1 means similar width, and r>>1 means top shape is much wider than bottom. From this, we can identify Type B as a design that approaches weak scattering when r goes to 0 and f approaches 1 (see FIG. 19), meaning that we end in a waveguide formed of only the bottom silicon layer. Type A ends in a waveguide comprising both layers with r=1 and f=1 (FIG. 19). Type C ends in a waveguide comprising only the top silicon layer, with r>>1 and f approaching 0. And, in Type D designs the structure terminates in absence of silicon in both layers at the weak end of the grating. This means the wave is not guided, and instead the grating couples an out of plane unguided beam to an in-plane unguided beam. This may also find certain applications.

Figure 15G:
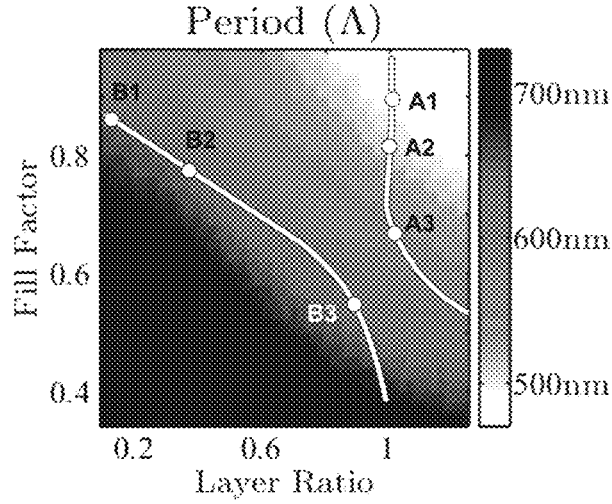
FIG. 15G shows the same information as FIG. 15C, with the addition of a white contour added to highlight the maximum directivity ridge for easy viewing.
Figure 15H:
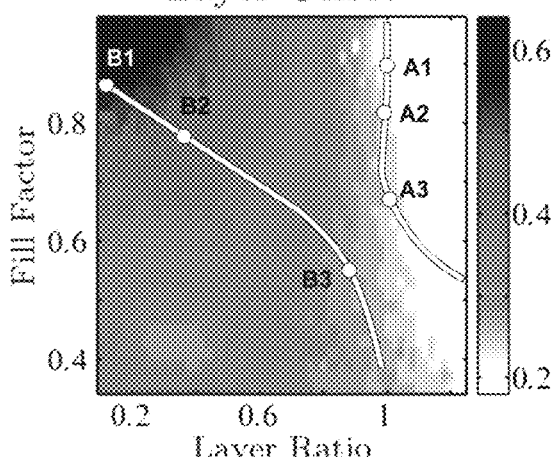
FIG. 15H shows the same information as FIG. 15D, with the addition of a white contour added to highlight the maximum directivity ridge for easy viewing.

In embodiments of the invention, we provide each of the Type A, B, C or D designs, where a grating is synthesized by starting with a desired beam distribution, deriving the needed grating strength, using a mode band structure solver to generate scattering strength/directivity maps such as in FIGS. 15A, 15E 15B, and 15F, choosing a design type—Type A, B, C, or D depending on desired terminating waveguide type, and reading off the desired grating strength vs. position from a curve such as FIG. 14A (per Dirk Taillaert et al., Optics Letters 2004), selecting from FIG. 19—depending on the desired design type—the appropriate part of the "high-directivity ridge", or high directivity region; then finding the desired scattering strength along the same ridge drawn in FIG. 15E (scattering strength plot), and using those 2 axis parameters (r, f) and two other derived parameters ($\Lambda$, $w_o$) derived from FIGS. 15G-15H to define each local unit cell. Repeating the process from left to right along the grating a "single shot" synthesis yields a design. Because the theory that provides this synthesis method is a continuum theory but the structure comprises discrete unit cells, high (e.g. as high as 95%) but not 100% coupling efficiencies are typically obtained. Local optimization or global optimization around this design point can quickly further improve efficiency.

An example can illustrate the synthesis process briefly. Consider the desired Gaussian beam shape of a particular beam width shown in FIG. 14A, with its corresponding desired scattering strength $\alpha(x)$ shown on the plot as well. Suppose the design maps of the unit cell design utilized are given in FIG. 15, and that we choose a Type A (Normal) design. Then, we start from the input waveguide, and choose a starting point on the desired scattering strength curve (e.g. first circle on the left). In FIG. 15E, we use the top right high directivity ridge to select a highly directional unit cell, and choose e.g. point A1 which shows weak scattering strength. Point A1 provides r and f, i.e. wt and wb. Then, point A1 in FIGS. 15G and 15H provides the corresponding $\Lambda$ and wo. The first unit cell is fully specified. Since it is $\Lambda$ wide, we go back to our first circle on FIG. 14A, and move a distance $\Lambda$ to the right, and read off a new value of desired scattering strength for the next unit cell. The next value requires a stronger scattering so we now use e.g. point A2. For a later cell with even stronger scattering we may use point A3. This process is repeated until the device is synthesized. Note that in FIG. 14A on the right, some scattering strengths were unachievable. This affects efficiency but because it happens in the outskirts of the beam the effect is not large.

Suppose, instead that we chose a Type B Inverted design, the above process would be the same but we would be using for example points B1 to B3 to select low to high scattering strengths.

This map does not cover the full parameter range for Type C and D designs, but the locations of equivalent C1 to C3 and D1 to D3 points are indicated in FIG. 15E.

FIGS. 16A-16E and 17A-17E show example designs. It is exemplified that the above procedure produces grating structures that utilize monotonically changing wt and wb along the grating structure.

Figure 16A:
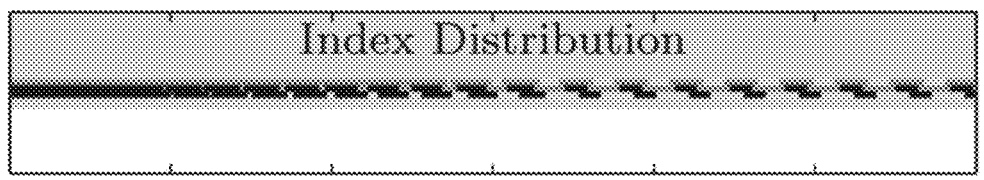
FIGS. 16A-E illustrate a Type A (Normal) synthesized grating design according to an embodiment of the invention, showing in FIG. 16A a structure cross-section, simulated field distribution in FIG. 16B, desired and designed beam shape in FIG. 16C, an top plan view optical micrograph of a fabricated device in FIG. 16D, and spectral response of directivity, coupling efficiency, and reflection back to waveguide input port in FIG. 16E; as well as the measured efficiency of a fabricated device for comparison. Waveguide port excitation is shown.
Figure 16B:
Figure 16C:
Figure 16D:
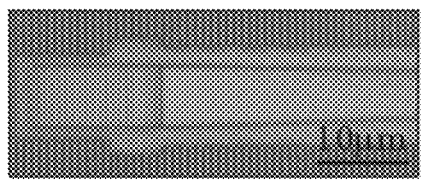
Figure 16E:
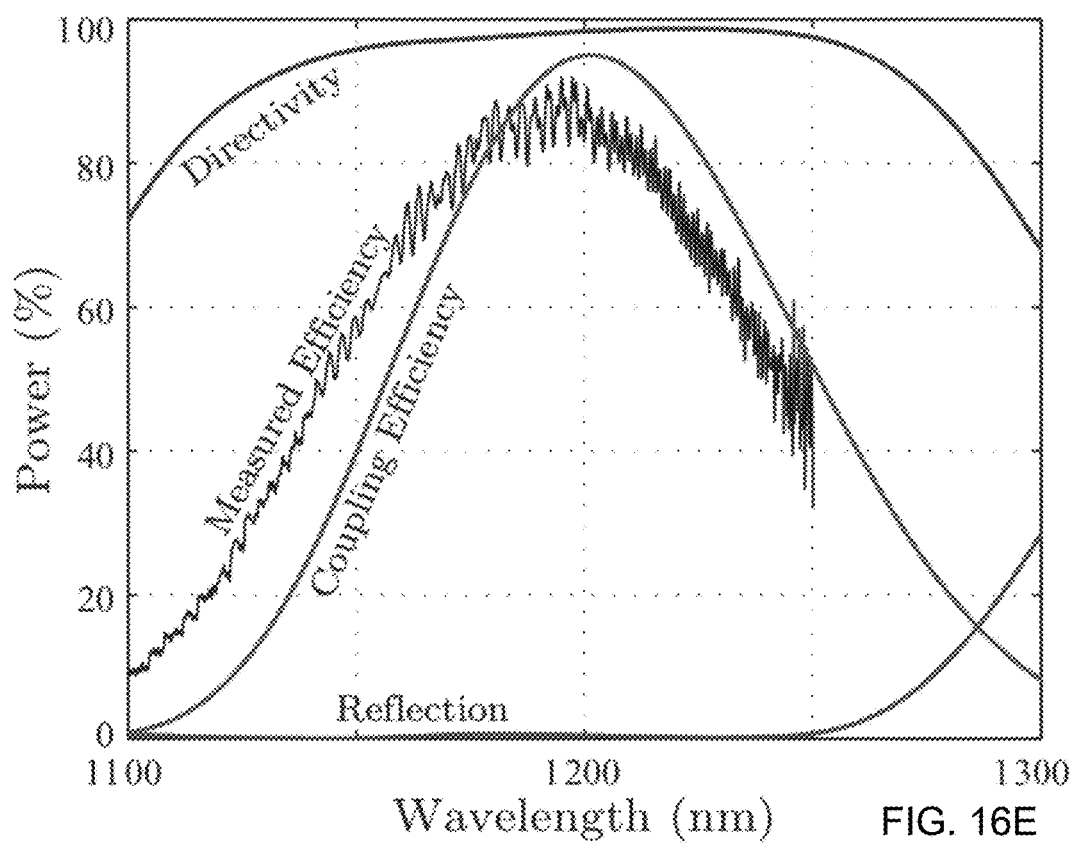

For example, in FIG. 16A, starting from the input waveguide, the bottom device layer has monotonically decreasing silicon shape widths, and the top device layer also has monotonically decreasing silicon shape widths. This is consistent with a step by step advance along FIG. 14A in desired/synthesized scattering strength (circles in FIG. 14A), and the smooth parameter map in FIGS. 15A and 15E for scattering strength along a high directivity contour and in the high directivity region (see FIGS. 15B and 15F for D>10 region and preferably D=100 to above 10000). It is typical of Type A designs to have monotonically decreasing wt and wb in the same direction. Furthermore, because the input waveguide region has a high duty cycle of silicon, these designs are efficient if they mate to a bi-layer input waveguide, that is, one formed of both of the device layers. A waveguide formed in only one or the other device layer provides an impedance mismatch, i.e. reflection, at the grating coupler input, which reduces coupling efficiency. However, bilayer waveguides when implemented in device layers formed of crystalline silicon and polysilicon, as done in the present examples, are lossy because polysilicon is is an optically lossy material and attenuates the propagating wave. Thus, these grating couplers are typically mated to a waveguide taper that tapers down to a single mode waveguide, but also transfers light from a two-layer waveguide to a single layer waveguide. In our example, the preferable layer for the waveguide is the crystalline silicon (low loss) waveguide layer, but in other material systems it could be either layer, or both could be utilized. It should be noted that Type A designs typically retain a close to constant wt to wb ratio (see FIGS. 15B and 15F). In FIG. 16A, it can be seen that narrow oxide gaps next to silicon shapes on the top and bottom layer are next to the waveguide input on the left, and the silicon shapes narrow (oxide gaps widen) in unison as one moves along the grating design to the right. In each unit cell, the left wall of a top silicon shape is left of the left wall of a bottom silicon shape in the same unit cell; and the right wall of the top silicon shape is left of the left wall of the bottom silicon shape. The monotonic tapering, however, produces a qualitative difference between the input and middle of the grating such that at the input, the top silicon shape overlaps the bottom silicon shape of the next cell to the left (for a downward radiating design), i.e. the left wall of the top silicon shape in a unit cell is to the left of the right wall of the bottom silicon shape of the unit cell to its left. In the middle of the grating structure, in the region of high strength scattering, the top silicon shape does not overlap the bottom silicon shape of adjacent unit cell.

Figure 17A:
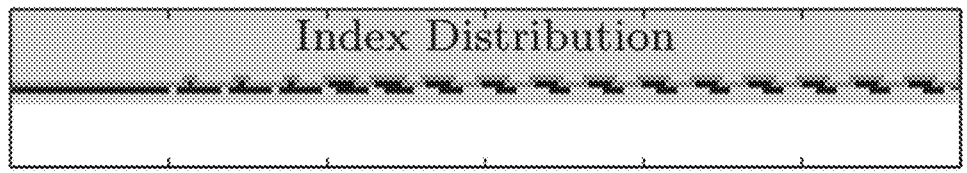
FIGS. 17A-E illustrate a Type B (Inverted) synthesized grating design according to another embodiment of the invention, showing the structure cross-section in FIG. 17A, simulated field distribution in FIG. 17B, desired and designed beam shape in FIG. 17C, an optical top plan view micrograph of the device in FIG. 17D, and spectral response of directivity, coupling efficiency, and reflection back to waveguide input port in FIG. 17E; as well as the measured efficiency of a fabricated device for comparison. Waveguide port excitation is shown.
Figure 17B:
Figure 17C:
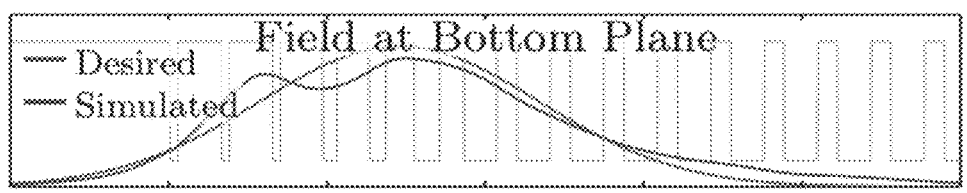
Figure 17D:
Figure 17E:
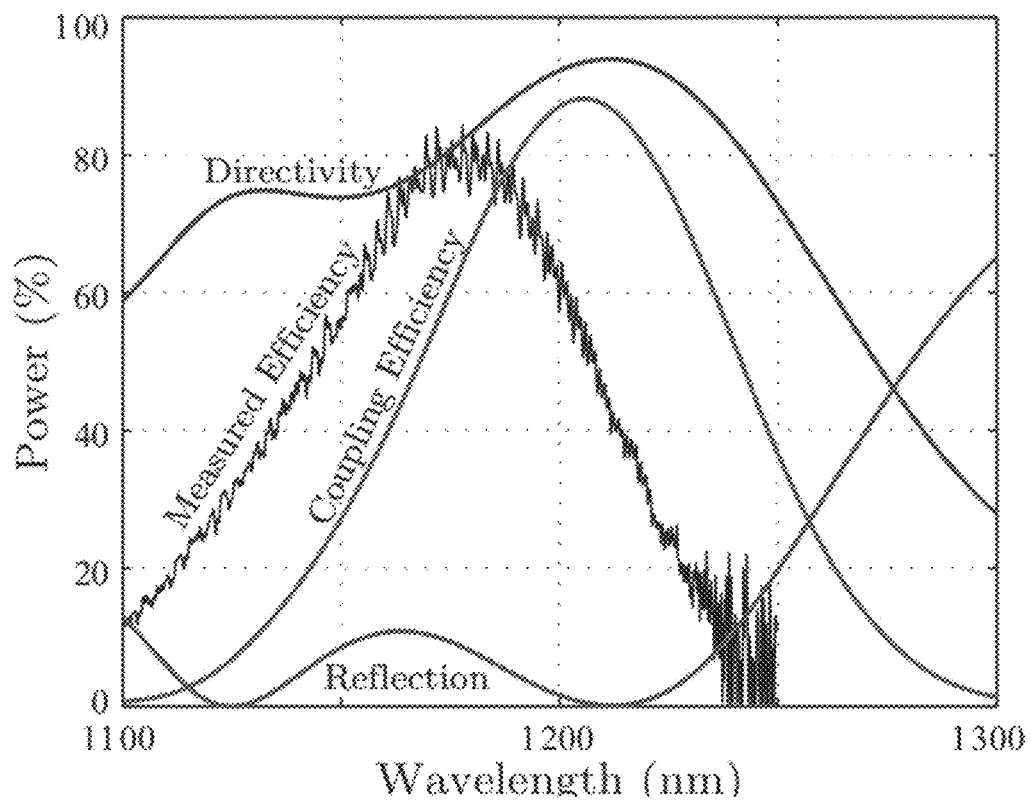
Figure 18:
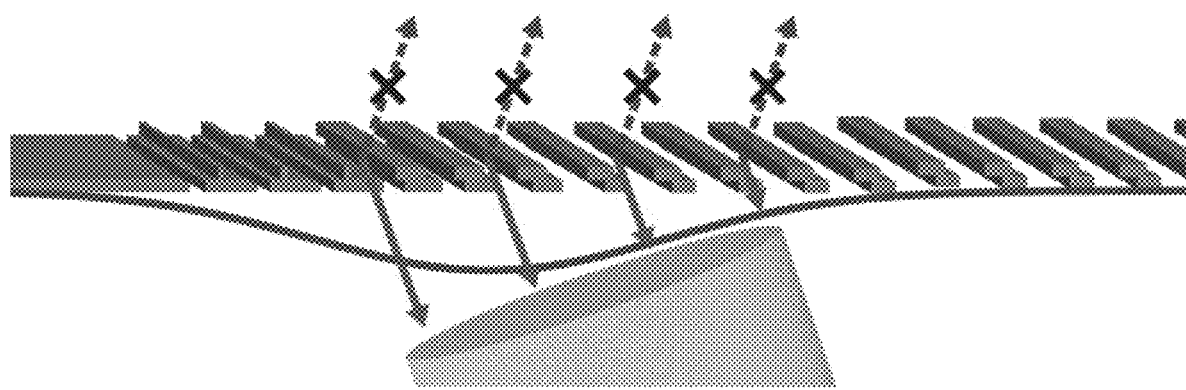
FIG. 18 shows a 3D rendering of an example grating coupler, here Type B (Inverted), according to the described invention.

In FIG. 17A, a different design (of Type B) is shown, in which the bottom device layer has monotonically decreasing silicon shape widths, but the top device layer has monotonically increasing silicon shape widths, starting from the input waveguide. This is consistent with a step by step advance along FIG. 14A in desired/synthesized scattering strength (circles in FIG. 14A), and the smooth parameter map in FIGS. 15A and 15E for scattering strength along a high directivity contour and in the high directivity region (see FIGS. 15B and 15F for D>10 region and preferably D=100 to above 10000). For Type B designs, the ratio r is changing rapidly, the period is not varying rapidly, so as the bottom layer shapes narrow along the grating, the top ones widen. This design is ideally suited to adiabatically mate, with ideal impedance match, to a single-layer waveguide, in this case in the bottom device layer. Notably, in the first unit cells next to the input waveguide, the top layer silicon shape is narrower than the bottom shape, and fully within the bottom shape (the left wall of the top shape being right of the left wall of the bottom shape); while to the right of the grating, the shapes align into high scattering strength directional radiation unit cells, where the top and bottom cell are similar width (if they the device layers are of similar thickness as they are here), and the top shape is to the left of the bottom shape, because it is a bottom radiating design. Because it is a bottom radiating design, the top shape is left of center above the bottom shape, i.e. it is a weak positive scatterer in proximity to the oxide gap left of the bottom shape that is a weak negative scatterer, their proximity creating a quarter-wavelength effective spacing, and the whole unit cell being close to a full optical wavelength or longer if the output radiation is in a forward up or down direction, away from the input waveguide. For small off normal angles forward or backward, the unit cell is about a wavelength long (effective wavelength equal to the free space wavelength divided by the effective index of the Bloch mode propagating in the grating structure). Up radiating designs look similar, but shift the top shapes to the left in such a way that the first top silicon shape is about the same distance to the left, rather than to the right, of the first small oxide gap on the bottom layer at the waveguide input port.

Figures 22A, 22B, 22C, 22D:
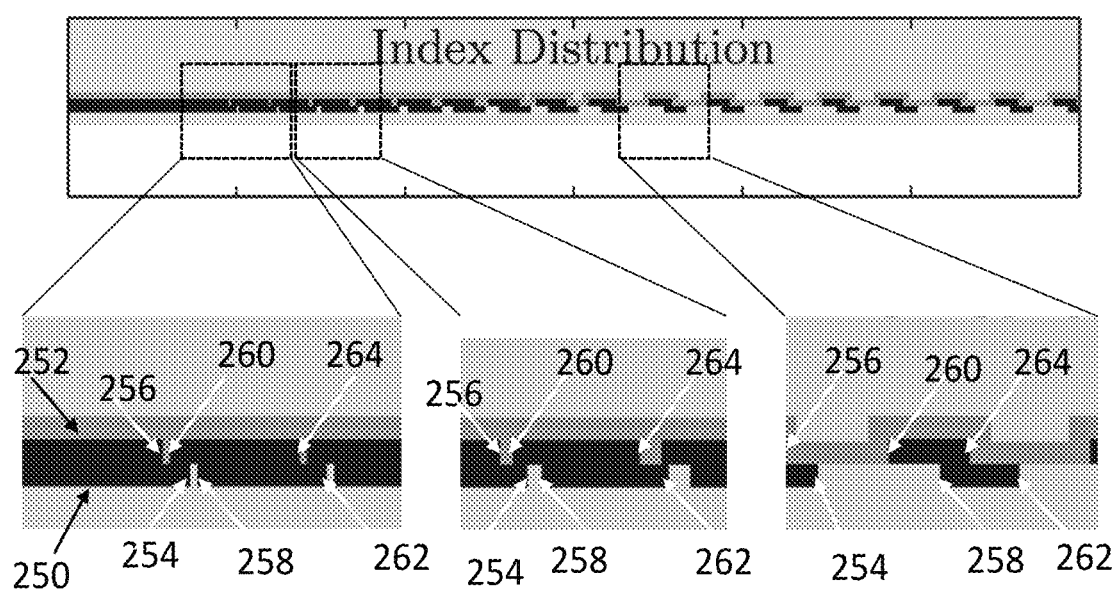
FIG. 22A shows a schematic cross-section of the same structure as FIG. 16A and indicates locations of three zoom-in regions.
FIGS. 22B, 22C and 22D show magnified regions of the structure of FIG. 22A.

Features of the monotonic tapering of the parameters of unit cells in the designs in FIG. 16A and FIG. 17A are illustrated in more detail in FIGS. 22A-D and 23A-C. FIG. 22A shows the design in FIG. 16A and shows the locations of three exemplary unit cells, one at the beginning of the grating near the input waveguide (FIG. 22B) with weak scattering, a second point further to the right in the grating cross-section with stronger scattering (FIG. 22C), and a third point in the region of strongest scattering (FIG. 22D). FIGS. 22B, 22C and 22D each show a unit cell as well as parts of the adjacent two unit cells to the left and right. In this design the offset wo is weakly changing along the structure (see points A1,A2,A3 in FIG. 15H), so the top silicon shape and bottom silicon shape have similar alignment from input through the grating. The left wall 260 of the top silicon shape is to the left of the left wall 258 of the bottom silicon shape, and the right wall 264 of the top silicon shape is to the left of the right wall 262 of the bottom silicon shape in the unit cell. FIG. 22B shows the first unit cell in the grating of FIGS. 16A and 22A. It is adjacent a bi-layer input waveguide 250, 252 having both a polysilicon waveguide part 252 and body silicon waveguide part 250, which optimally matches the grating input to the input waveguide 250,252. The weak scatterers in this case are the oxide gaps between polysilicon shapes in each layer. To provide a high efficiency design, three types of top-to-bottom silicon shape alignment are utilized in this example. In the weak scatterers, the top silicon shape overlaps the bottom silicon shape of the cell to its left (in the first scatter it overlaps the bottom layer part 250 of the input waveguide). Hence, in FIG. 22B, the left wall 260 of the top silicon shape is left of the right wall 254 of the bottom layer part 250 of the input waveguide. In FIG. 22C, for the following unit cells, the left wall 260 of the top silicon shape of the unit cell is to the left of the right wall 254 of the bottom silicon shape of the unit cell to its left. At a further point in the structure, FIG. 22D shows a high scattering strength unit cell, where the top silicon shape does not overlap the bottom silicon shape of the adjacent unit cell. That is, in FIGS. 22D (and 22C) the left wall 260 of the top silicon shape is to the right of the right wall 254 of the adjacent unit cell to the left. In certain fabrication processes, any alignment between shapes is permitted. In other fabrication processes, especially certain unmodified CMOS processes, design rules may require a minimum overlap or underlap (i.e. spacing between), so, a minimum spacing between the walls, of a shape in the top silicon and a shape in the bottom silicon. Such minimum spacings may be 50-100 nm, but in advanced processes may be considerably smaller as process nodes advance. In these cases certain unit cell designs may be disqualified and we may need to use the closest available cell that meets design rules. Such rules may be waived in either CMOS or custom processes to allow ideal implementation of the structures.

FIG. 23A shows the design in FIG. 17A and shows the locations of two exemplary unit cells, one at the beginning of the grating near the input waveguide (FIG. 23B) with weak scattering, and a second point in the region of strongest scattering (FIG. 22C). In FIG. 23B, we see that a downward output radiation design has produced a small oxide gap in the bottom layer and a small silicon shape in the top layer such that the top silicon shape is atop the bottom silicon shape in the unit cell and is entirely enclosed by it. That is, the left wall 280 of the top silicon shape is to the right of the left wall 278 of the bottom silicon shape, while the right wall 284 of the top silicon shape is to the left of the right wall 282 of the bottom silicon shape. This unit cell mates to a bottom layer only input waveguide 270. On the other hand, at a point further in the grating, strongly scattering unit cells have the same design as those of the Type A design in FIGS. 16A and 22A. That is, in FIG. 23C, left wall 280 of the top silicon shape is to the left of the left wall 278 of the bottom silicon shape, and the right wall 284 of the top silicon shape is to the left of the right wall 282 of the bottom silicon shape in the unit cell.

An advantage of the Type B design over Type A is as follows. In CMOS SOI technology, the top layer is poly silicon, which attenuates light. Type B design has no polysilicon in the input waveguide, and further very little polysilicon in the beginning of the grating. Wide top layer, i.e. polysilicon, shapes are introduced only when needed to provide the strong directional scattering. However, a down side of design Type B (FIG. 17A) relative to Type A (FIG. 16A) is that it may be more restricted by design rules because walls of top and bottom shapes cross during the tapering of unit cell parameters along the structure in opposite directions (i.e. top silicon shapes widening and bottom silicon shapes narrowing going from the left to right).

For the purposes of these descriptions, we define a difference in unit cells to refer to a pair of unit cells where at least one cell parameter in a first and a second unit cell has a different value. We define monotonic variation as an array of at least three unit cells, defining two differences in a parameter, for example the width difference between unit cell 1 and unit cell 2, and the difference between unit cell 2 and unit cell 3. A monotonic variation in such an array means that the difference in parameter from one pair of adjacent cells to the next is of the same sign (>0 or <0). In the disclosed grating designs, typically at least three, but usually at least a group of several—or all—unit cells have a monotonic variation in at least one parameter. In FIGS. 16A-16E and 17A-17E, the wt and wb parameters vary monotonically.

FIGS. 16A-16E shows a Type A (normal) embodiment of the invention. It shows 95% peak efficiency simulated (92% measured), 99% directivity, and 100 nm 3 dB bandwidth. Measured results closely correspond to design. This design is realized in the polysilicon gate and transistor body layers of a 45 nm CMOS SOI process with a silicon nitride liner, the nitride appearing as a conformal layer atop the polysilicon layer in FIG. 16A.

FIGS. 17A-17E shows a Type B (inverted) embodiment of the invention. It shows 88% peak efficiency simulated (84% measured) and 81 nm 3 dB bandwidth. Measured results closely correspond to design. This design is realized in the polysilicon gate and transistor body layers of a 45 nm CMOS SOI process with a silicon nitride liner, the nitride appearing as a conformal layer atop the polysilicon layer in FIG. 16A).

The following table summarizes the performance of these example designs. "Poly-body interfacing design" refers to the Type A design in FIG. 16A-16E. "Body interfacing" design refers to the Type B design in FIG. 17A-17E.

TABLE 1

Simulated and experimentally measured performance of example designs

| | Poly-Body-Interfacing | | Body-Interfacing | |
| --- | --- | --- | --- | --- |
| | Simulation | Experiment | Simulation | Experiment |
| Coupling Efficiency (%) | 95% | 92% | 88% | 84% |
| Coupling Efficiency (dB) | −0.2 dB | −0.36 dB | −0.5 dB | −0.76 dB |
| 3 dB Bandwidth | 100 nm | ~110 nm | 81 nm | ~80 nm |
| Wavelength | 1201 nm | 1197 nm | 1206 nm | 1178 nm |
| Angle | 19° | 18° | 19° | 19° |
| Taper Loss (dB) | | −2.15 dB | | −0.40 dB |
| Directivity | 99% | | 94% | |
| Reflection | 0.4% | | 0.5% | |

The Type A and B designs are particularly important for silicon photonics applications, and those utilizing two silicon device layers. This is because typically a bottom silicon layer can be crystalline silicon while a top silicon layer is typically polysilicon if the two layers are independently patternable. The Type B (inverted) design is particularly important for CMOS SOI applications because it terminates in the bottom silicon layer, which is crystalline silicon in CMOS SOI and allows low loss waveguides, while the top silicon is polysilicon which is typically lossy, having losses typically 50-150 dB/cm. The grating is short enough for the optical field to not experience significant loss or. attenuation from the polysilicon, during its propagation through the coupler, but use of the polysilicon is often avoided for waveguiding. Use of the polysilicon within the grating coupler structure does not impair coupler efficiency significantly due to the short length of the coupler. For example, even if polysilicon loss were 100 dB/cm, and duty cycle of use of the polysilicon in the coupler reduced that effectively to about 50 dB/cm, the typical grating coupler length of 10-20 microns means that a signal travels about 10 microns on average within the plane of the coupler leading to 50 dB/cm×0.001 cm=0.05 dB or 1% loss. Note that the Type B (Inverted) design in FIG. 17A-E shows a unit cell with switched order of scatterers in terms of ordering from the input waveguide port, in comparison to the Type A (Normal) design in FIG. 16A-E. That is, in the Type A Normal design (designed to radiate down), top and bottom scatterers are oxide gaps, and the top layer oxide gap in each unit cell is closer to the input waveguide on the left than the bottom layer oxide gap in the same cell. On the other hand, in the Type B Inverted design (designed to radiate down), the top and bottom scatterers are polysilicon bar and oxide gap, respectively. Because of the opposite polarity of scatterer, the order is reversed, with the bottom layer oxide gaps closer to the input waveguide within each unit cell. Furthermore, in the Type B design, from the input to the grating (on the left in FIGS. 16A-16E or 17A-17E) toward the end of the grating (on the right in FIGS. 16A-16E or 17A-17E), the top silicon blocks start from small width and become wider toward the end of the grating (right side on the figure), while on the bottom layer they start wide and become narrow toward the end of the grating. That is, the widths wb and wt are respectively increasing and decreasing along the length of the coupler. This is a unique and universal feature of this design, and will remain so in other similar processes, device layer thicknesses, material systems, etc.

Type C Inverted #2 designs mate to an input waveguide on the top layer only. They could be useful in photonic integrated circuits where, for example, the top waveguide is a formed in a low-loss high index dielectric material such as. silicon rich silicon nitride, silicon carbide, chalcogenide glass, etc., disposed above a crystalline silicon bottom layer, where the bottom Si layer is used to provide directionality in grating regions, with bottom shapes in silicon and top shapes in the high index dielectric, but the primary waveguide is implemented in the top layer low-loss dielectric.

A Type C design can be considered to have all the properties of a Type B design when in the Type B design the two device layers including the patterns on them are interchanged.

Thus in an embodiment of the invention, the top layer silicon width increases while the bottom layer silicon width decreases along the grating. Equivalently, scatterer strengths increase along the grating if one considers a silicon (positive) scatterer in the top layer, and a gap (negative) scatterer in the bottom layer.

Figure 6:
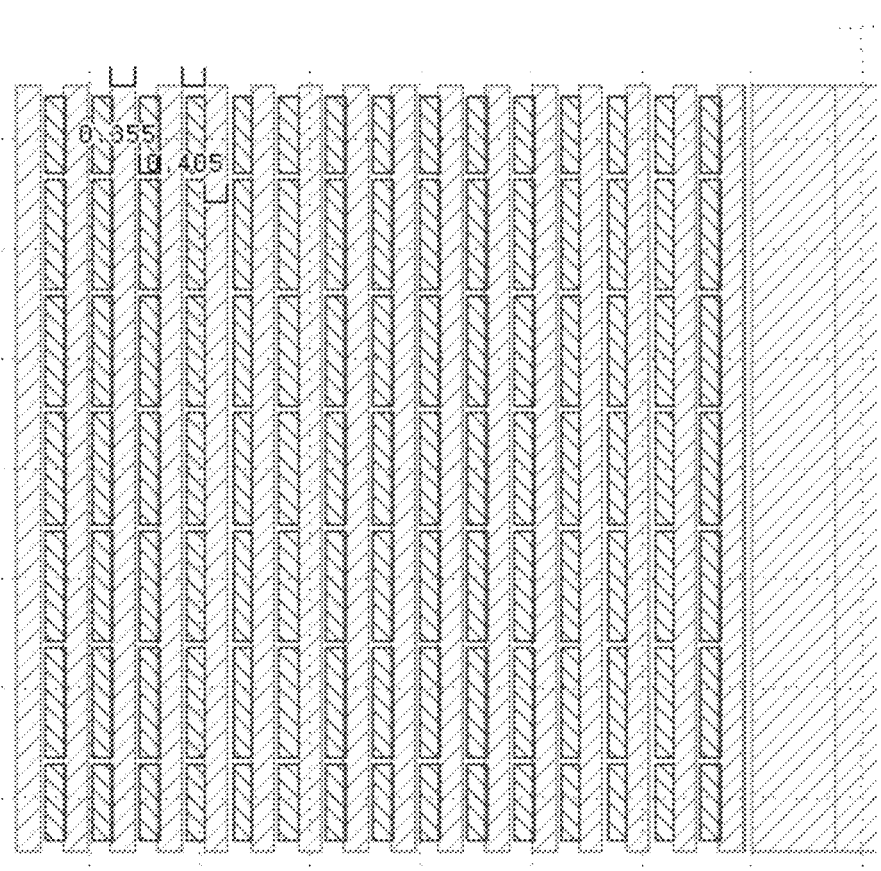
Figure 7:
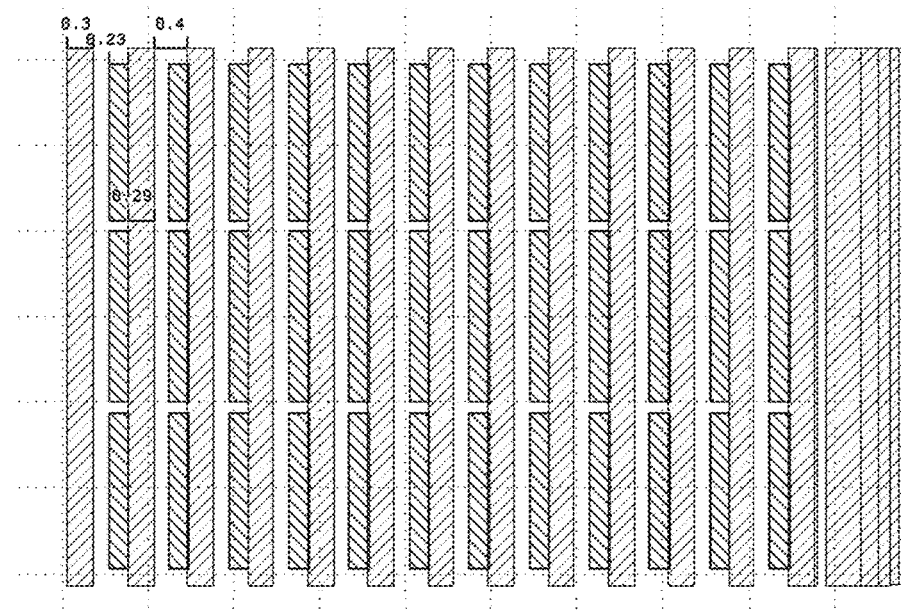
Figure 8:
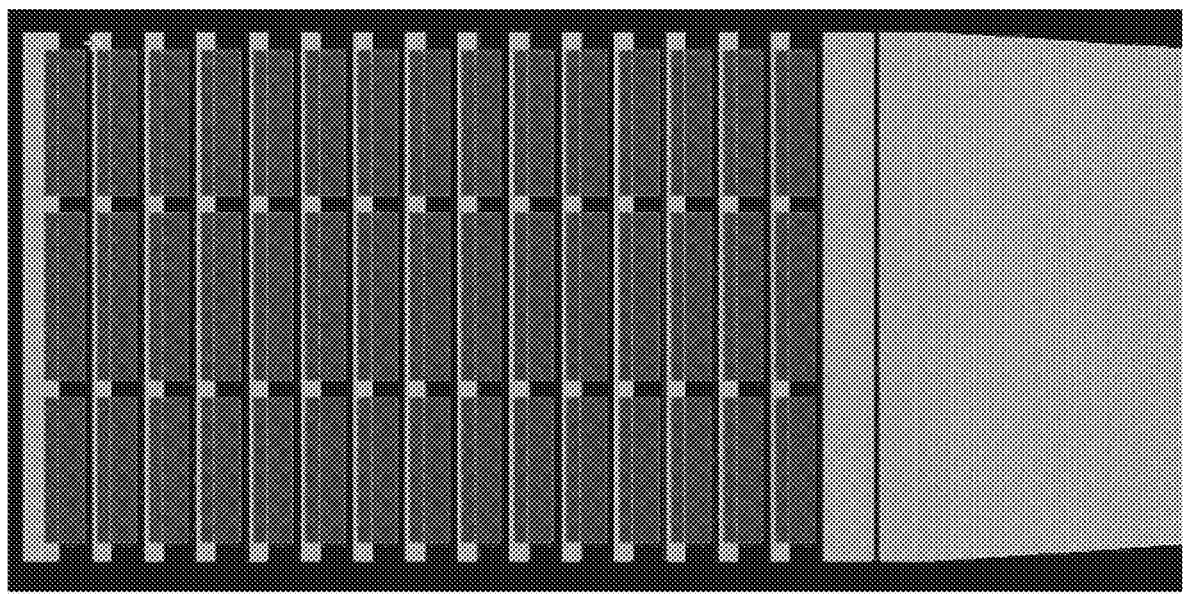

Different approaches can be used that use predetermined changes in width of silicon to modulate scattering strength including transverse segmentation with different fill factors, as shown in examples in FIGS. 6-8. Transverse segmentation has been employed in single-layer grating coupler designs to circumvent critical dimension limitations but also to control the scattering strength by means different than controlling the width of the bars.

A grating coupler alone, if linear, couples light from an out of plane beam or fiber to a wide input waveguide. It is known in the art that such waveguides can be mated to narrow single mode waveguides using adiabatic in-plane waveguide tapers which provide mating at low to negligible cost in optical losses. This approach can connect Type B and C designs to single mode waveguides. It can also connect a Type A grating coupler design to a single mode waveguide comprising a stack of polysilicon and body silicon. Alternatively, a dual taper could be designed to transition from a wide waveguide with two silicon layers to a narrow waveguide with a single silicon layer, in order to couple a Type A design into a bottom layer, crystalline silicon waveguide only.

The example embodiments described above specify silicon top and bottom layers, due to their utility in silicon photonics and CMOS process technology, but any high index materials could be used for the two layers. The concepts also work in a uniform background material, or with the scatterers embedded in a material layer stack (as e.g. shown in examples in FIGS. 16 and 17).

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween. It is also anticipated that steps of methods may be performed in an order different from that illustrated and still be within the meaning of the claims.

What is claimed is:

1. A grating coupler configured to couple radiation between a waveguide and radiation of a beam port at an angle out of a plane that is defined by the grating coupler, the grating coupler comprising:

first patterned shapes in a first layer, the first layer comprising a first planar material, and second patterned shapes in a second layer, the second layer comprising a second planar material; and a plurality of adjacent unit cells arranged along a direction of propagation of light in the grating coupler, each unit cell comprising a first shape and a second shape, the first shape of each unit cell being of the first patterned shapes and the second shape of each unit cell being of the second patterned shapes, each unit cell having design parameters comprising a width wb of the first shape, and a width wt of the second shape;

wherein widths wb of the first shapes of the plurality of unit cells progressively increase along the direction of propagation of light in the grating coupler while widths wt of the second shapes of the plurality of the unit cells progressively decrease along the direction of propagation of light in the grating coupler; and a spacing between the first layer comprising the first planar material and the second layer comprising the second planar material that is less than an effective wavelength of the light in a background material.

2. The grating coupler of claim 1, where a second unit cell is configured to have a radiation strength α that differs from that of a first unit cell by at least 20% and the first and second unit cell have directionality of at least 10 dB.

3. The grating coupler of claim 1, wherein the second unit cell has a cell width that, when implemented as the unit cell of a uniform periodic grating, produces an output radiation at an angle that differs from that of the first cell by at least one degree, the combination of a plurality of cells including the first and second unit cells adapted to produce a converging beam at the beam port.

4. The coupler of claim 1 wherein the first unit cell is closer to the input waveguide than a third unit cell, the third unit cell being closer to the input waveguide than the second unit cell, and the first unit cell is configured to have an output angle θ1 that leans forward away from the input waveguide and the second unit cell is configured to have an output angle θ2 that leans backward, toward the input waveguide.

5. The grating coupler of claim 1, where the unit cells have a locally monotonically increasing width wt of the shapes in the second planar material from the waveguide to an end of the coupler distant from the waveguide.

6. The grating coupler of claim 1 wherein the waveguide comprises a shape formed in the first planar material layer.

7. The grating coupler of claim 1, where the unit cells have a locally monotonically decreasing width wt of the shapes in the second planar material from the waveguide to a distal terminus of the coupler.

8. The grating coupler of claim 1 wherein the waveguide comprises a shape formed in the second planar material layer.

9. The grating coupler of claim 1 wherein the first and second planar material have similar indexes of refraction.

10. The grating coupler of claim 1, where an offset between the first edge of the first shape and the first edge of the second shape of the second unit cell is smaller than an offset between the first edge of the first shape and the first edge of the second shape in the first unit cell.

11. The grating coupler of claim 10, where the cell width A of the first unit cell is approximately the same as the cell width A of the second unit cell.

12. The grating coupler of claim 1, the first planar material being formed prior to the second planar material.

13. The grating coupler of claim 12, the first planar material being an active layer also used for source and drain of transistors of an integrated circuit, and the second planar material being a polysilicon layer also used as a gate layer of transistors of the integrated circuit.

14. The grating coupler of claim 13, configured such that light emitted from a surface of the coupler proximate the first planar layer being more intense than light emitted from a surface of the coupler proximate the second planar layer.

15. The grating coupler of claim 1, where the waveguide is implemented in the first material layer.

16. The grating coupler of claim 1 where the first and the second planar material layers are separated by approximately a quarter wavelength in the vertical directions.

17. The grating coupler of claim 1 where the first and second planar material layers are spaced vertically by less than one effective wavelength in the background material.

18. The grating coupler of claim 1 where the first and second planar material layers have a high refractive index contrast with the background material.

19. The grating coupler of claim 1 wherein the first shapes and the second shapes of each unit cell overlap if viewed from above.

20. The grating coupler of claim 1 where a period of the first shapes is nonuniform but does not change rapidly.

* * * * *